United States Patent
Zaitsu et al.

(10) Patent No.: US 7,959,843 B2
(45) Date of Patent: Jun. 14, 2011

(54) METHOD OF FABRICATING STRUCTURE

(75) Inventors: Yoshitaka Zaitsu, Ichikawa (JP); Chienliu Chang, Kawasaki (JP); Masao Majima, Isehara (JP); Hironobu Maeda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 50 days.

(21) Appl. No.: 12/486,749

(22) Filed: Jun. 18, 2009

(65) Prior Publication Data

US 2009/0315217 A1 Dec. 24, 2009

(30) Foreign Application Priority Data

Jun. 24, 2008 (JP) .................................. 2008-165080

(51) Int. Cl.
*B29C 59/02* (2006.01)
(52) U.S. Cl. .......... 264/320; 264/138; 264/161; 29/445; 29/505; 29/432
(58) Field of Classification Search .......................... None
See application file for complete search history.

(56) References Cited

U.S. PATENT DOCUMENTS

| 6,200,172 | B1 * | 3/2001 | Konoya et al. ............. 439/752 |
| 7,085,122 | B2 | 8/2006 | Wu |
| 7,089,666 | B2 | 8/2006 | Kim |
| 2004/0245871 | A1 | 12/2004 | Kim |
| 2008/0289128 | A1 * | 11/2008 | Billig et al. ............. 15/104.94 |
| 2009/0031548 | A1 * | 2/2009 | Zaitsu et al. .................. 29/445 |

FOREIGN PATENT DOCUMENTS

| JP | 2004-219839 A | 8/2004 |
| JP | 2005-224933 A | 8/2005 |
| JP | 2006-296138 A | 10/2006 |

* cited by examiner

*Primary Examiner* — Monica A Huson

(74) *Attorney, Agent, or Firm* — Canon U.S.A., Inc., IP Division

(57) ABSTRACT

In a method of fabricating a structure by plastically deforming a processing portion provided at a movable segment, a restraint segment configured to restrain movement of the movable segment is provided before an external force is applied to the processing portion. After processing of the processing portion is completed, the restraint segment is removed.

15 Claims, 24 Drawing Sheets

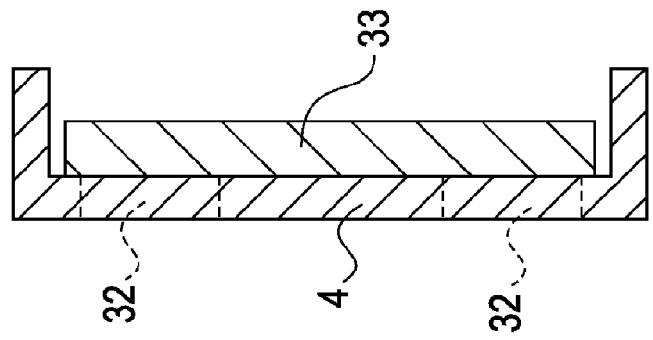
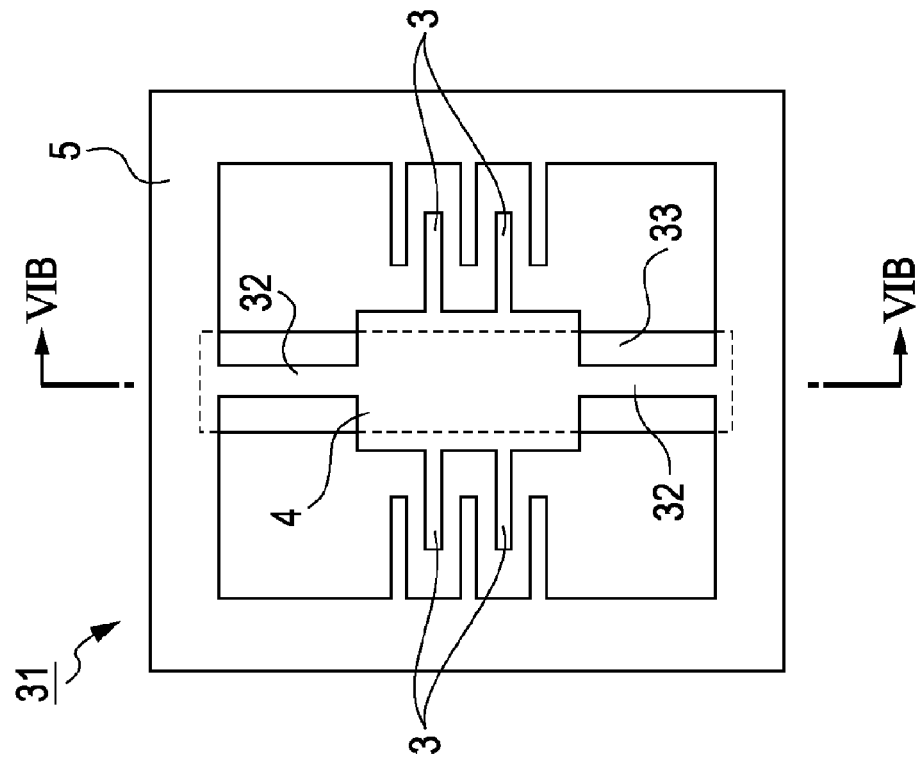

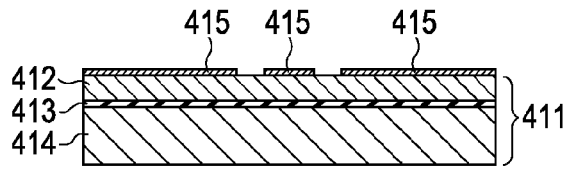
FIG. 14A
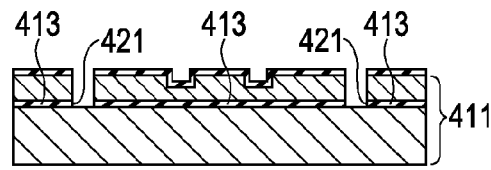
FIG. 14G
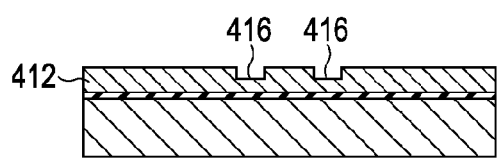
FIG. 14B
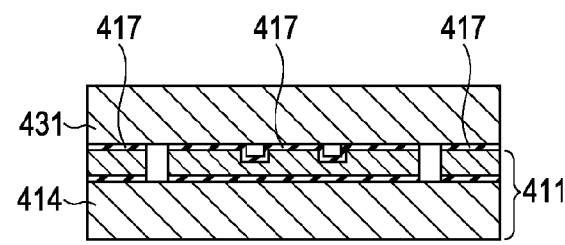
FIG. 14H
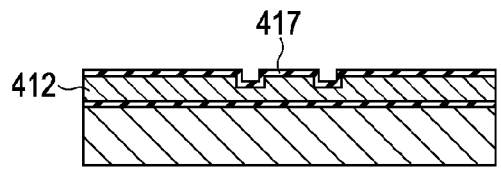
FIG. 14C
FIG. 14I
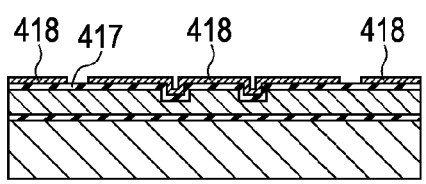
FIG. 14D
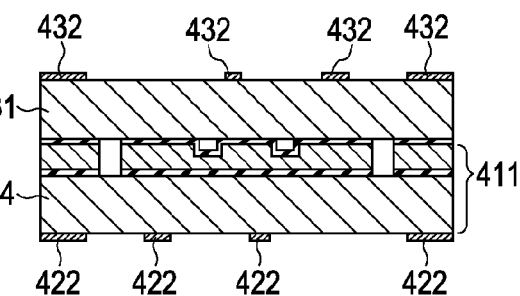
FIG. 14E
FIG. 14J
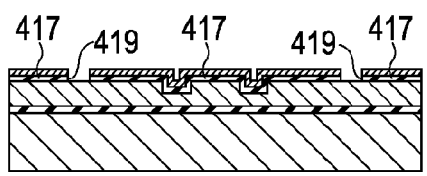
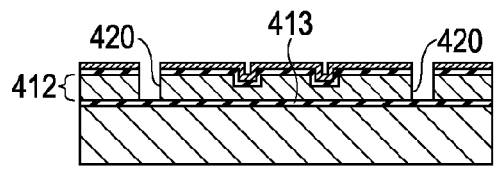
FIG. 14F
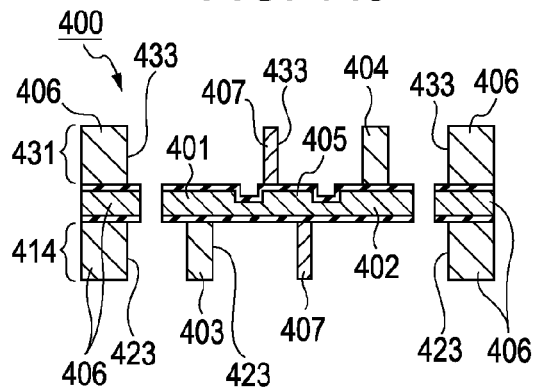

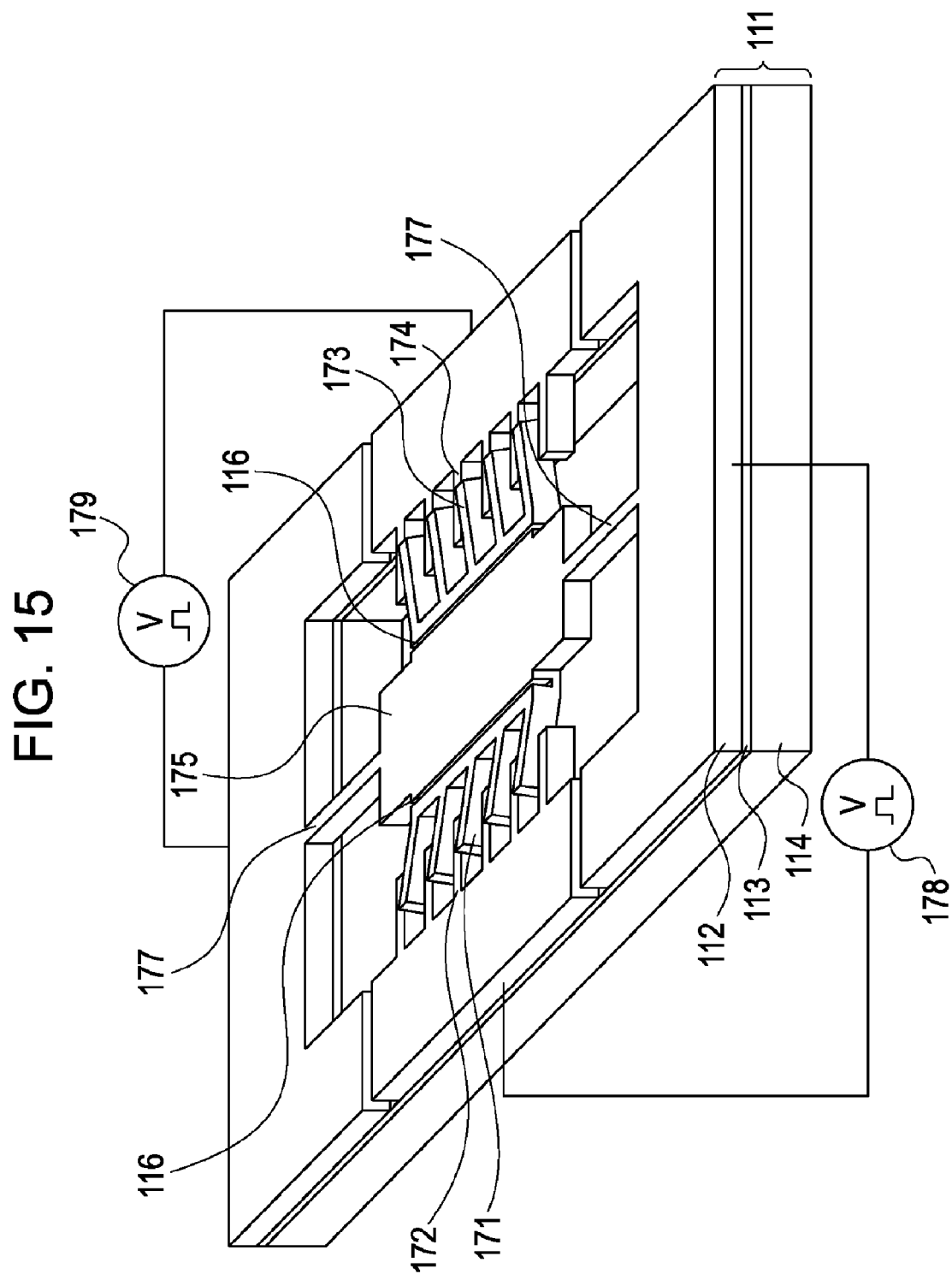

METHOD OF FABRICATING STRUCTURE

BACKGROUND OF THE INVENTION

1. Field of the Invention

The present invention relates to a method of fabricating a structure having a beam-like structure represented by a comb structure used for a sensor or an actuator fabricated by, for example, MEMS technique. The term MEMS is an abbreviation for micro electro mechanical systems.

2. Description of the Related Art

The term VC is an abbreviation for vertical comb structure. In the vertical comb structure, a pair of comb segments of a comb structure are arranged to mesh with each other, and the pair of comb segments are supported by an elastic member, for example, processed into a beam-like shape, so that one of the comb segments is displaceable outward of a plane (in a direction intersecting with a principal surface of the comb structure).

Such a structure can be fabricated as a very small structure such that, for example, a width of a single comb piece is about 5 μm, by using micro-fabrication technique to which semiconductor processing technique called MEMS is applied.

The vertical comb structure fabricated by MEMS is employed for, for example, a micro-mirror for optical-path conversion or a variable capacitor for wireless communication equipment.

For specific example, the vertical comb structure can be used as an electrode portion for an electrostatic comb actuator, in which a very small vibration structure is driven with an electrostatic force.

In the electrostatic comb actuator using the vertical comb structure, it is necessary to generate a large driving force to displace the comb structure from an initial position.

Hence, an angular vertical comb structure (AVC) and a method of fabricating the AVC are disclosed as an example of the comb structure capable of increasing the driving force (see U.S. Pat. No. 7,089,666).

FIGS. 20A to 20C show the overview of the AVC and the method of fabricating the AVC disclosed in U.S. Pat. No. 7,089,666.

The AVC disclosed in U.S. Pat. No. 7,089,666 has a structure shown in FIG. 20A.

An AVC 500 includes a movable comb segment 501 at one side of a board 503 which is supported by a torsion spring 505 and is capable of vibrating in a rotation direction.

The torsion spring 505 is made of a material, for example, monocrystalline silicon, which is plastically deformable with heat.

FIGS. 20B and 20C show a method of inclining the movable comb segment 501.

Referring to FIG. 20B, a mold 506 having a pillar 507 is pressed to the board 503 in a direction indicated by a straight arrow in the drawing such that the pillar 507 contacts an upper surface of the board 503 at a position opposite to the movable comb segment 501. Then, the board 503 is heated.

Accordingly, the board 503 rotates in a direction indicated by a curved arrow in the drawing. The torsion spring 505 is plastically deformed into a shape to keep a rotation angle of the board 503.

Then, the board 503 is cooled, and the mold 506 is detached. The board 503 is kept inclined as shown in FIG. 20C, and a comb segment 501 formed at a side surface of the board 503 is also kept inclined with the board 503.

SUMMARY OF THE INVENTION

The present invention suggests a new method of fabricating a structure by plastically deforming a processing portion, provided at a movable segment supported by a substrate, thereby having an inclined portion inclined with respect to a principal surface of the movable segment.

Thus, the present invention provides a method of fabricating a structure capable of, when the processing portion is to be inclined outward of a plane, decreasing a deformation of a portion not occupied by the processing portion to be inclined, without limiting the degree of freedom for design of the structure.

The present invention suggests the following configuration as a method of fabricating a structure including a segment which is inclined outward of a plane.

A method according to an aspect of the invention is a method of fabricating a structure by plastically deforming a processing portion, provided at a movable segment supported by a substrate, thereby having an inclined portion inclined with respect to a principal surface of the movable segment. The method includes the steps of providing a restraint segment configured to restrain movement of the movable segment; applying a force to the processing portion, thereby plastically deforming the processing portion; and removing at least a part of the restraint segment.

With the aspect, when the processing portion provided at the movable segment supported by the substrate is plastically deformed to fabricate the structure having the inclined portion inclined with respect to the principal surface of the movable segment, the free movement of the movable segment is restrained by the restraint segment. Accordingly, the movement of the movable segment can be temporarily restrained.

Also, with the aspect, when the processing portion is to be plastically deformed, a stress can be selectively applied to only the processing portion. Accordingly, processing accuracy increases.

Further, with the aspect, a deformation of a portion other than the processing portion to be inclined can be decreased without decreasing the degree of freedom for design of the structure.

Further features of the present invention will become apparent from the following description of exemplary embodiments with reference to the attached drawings.

BRIEF DESCRIPTION OF THE DRAWINGS

FIGS. 6A and 6B are process diagrams showing the overview of a sixth example of a method of fabricating a structure according to an embodiment of the invention.

FIG. 15 illustrates an example of an AVC fabricated by the method of fabricating a structure according to the first embodiment of the invention.

DESCRIPTION OF THE EMBODIMENTS

Figure 1A:
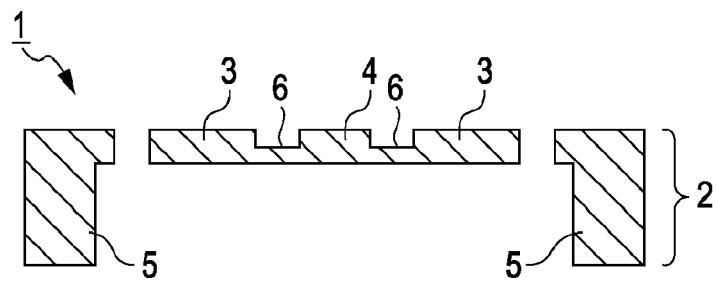
FIGS. 1A to 1D are process diagrams showing the overview of a first example of a method of fabricating a structure according to an embodiment of the invention.

The overview of a method of fabricating a structure according to an embodiment of the invention will be described below.

The method of fabricating a structure according to the embodiment of the invention mainly includes four steps (a) to (d).

FIGS. 1A to 1D respectively correspond to steps (a) to (d).

(a) A substrate 2 is processed to fabricate a structure 1.

The structure 1 includes a processing portion 3, a movable segment 4 to which one end of the processing portion 3 is fixed, and a support segment 5 which movably supports the movable segment 4. Referring to FIGS. 1A to 1D, the number of processing portions may be one or more.

Here, a position serving as a base point for plastic deformation of the processing portion 3 (i.e., a position to be deformed) may be processed so that the processing portion 3 is easily plastically deformed.

For example, a recess 6 may be provided by decreasing the thickness of that portion so that the intensity of that portion becomes low as compared with the periphery.

(b) A restraint segment 7 (also referred to as restraint member) having a projection 8 is fixed to the structure 1 such that the projection 8 of the restraint segment 7 contacts the movable segment 4 and restrains the movement of the movable segment 4.

(c) The processing portion 3 is plastically deformed by applying an external force to the processing portion 3. The processing portion 3 is processed to be inclined with respect to a principal surface of the movable segment 4. Here, the principal surface of the movable segment 4 is a surface of the movable segment 4 which is not processed yet but is to be mainly processed. The principal surface of the movable segment 4 is a front or back surface.

Figure 1B:
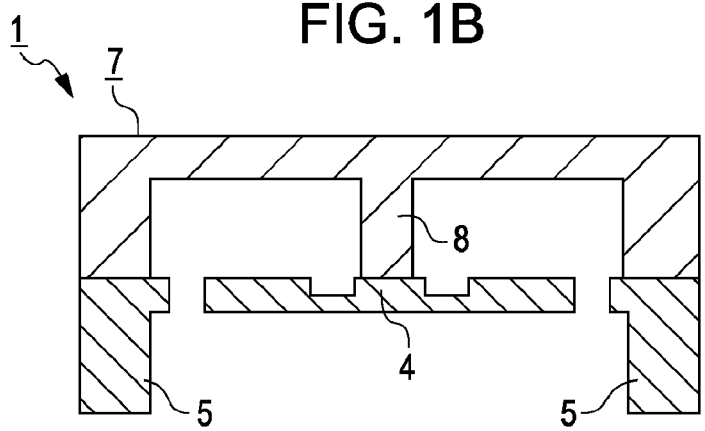
Figure 1C:
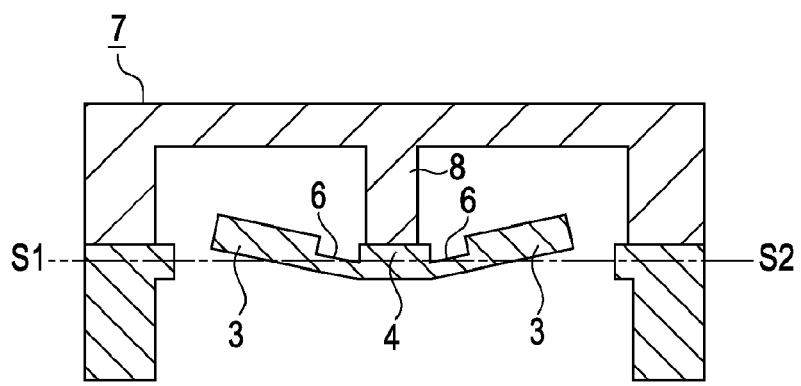
Figure 1D:
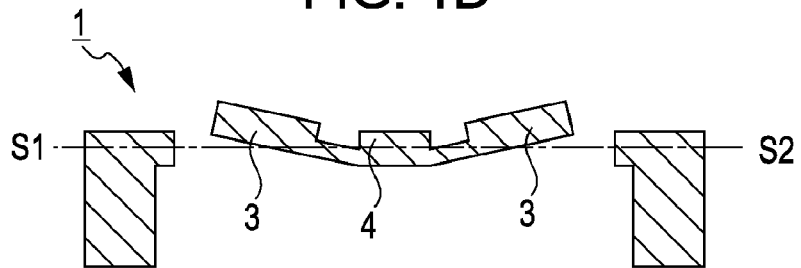

In FIG. 1C, broken line S1-S2 represents a principal surface of the movable segment 4 before processing.

At this time, to promote plastic deformation of the processing portion 3, a part of the processing portion 3 or the entire processing portion 3 may be heated to achieve at least a temperature at which the processing portion 3 can be plastically deformed.

Heating may be started before the deformation of the processing portion 3 or during the deformation.

(d) The restraint segment 7 is detached from the structure 1.

Figure 2A:
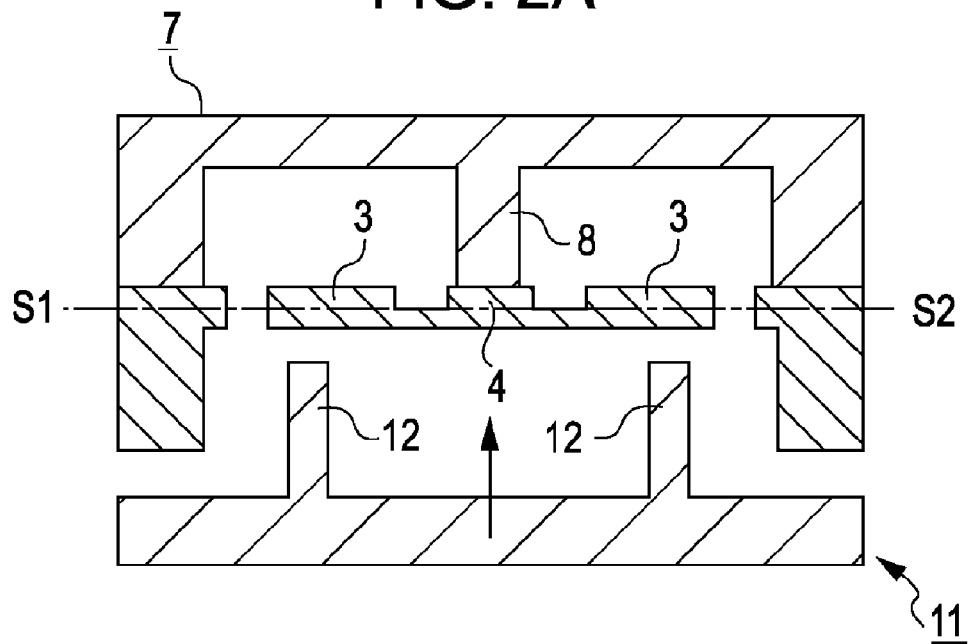
FIGS. 2A and 2B are process diagrams showing the overview of a second example of a method of fabricating a structure according to an embodiment of the invention.
Figure 2B:
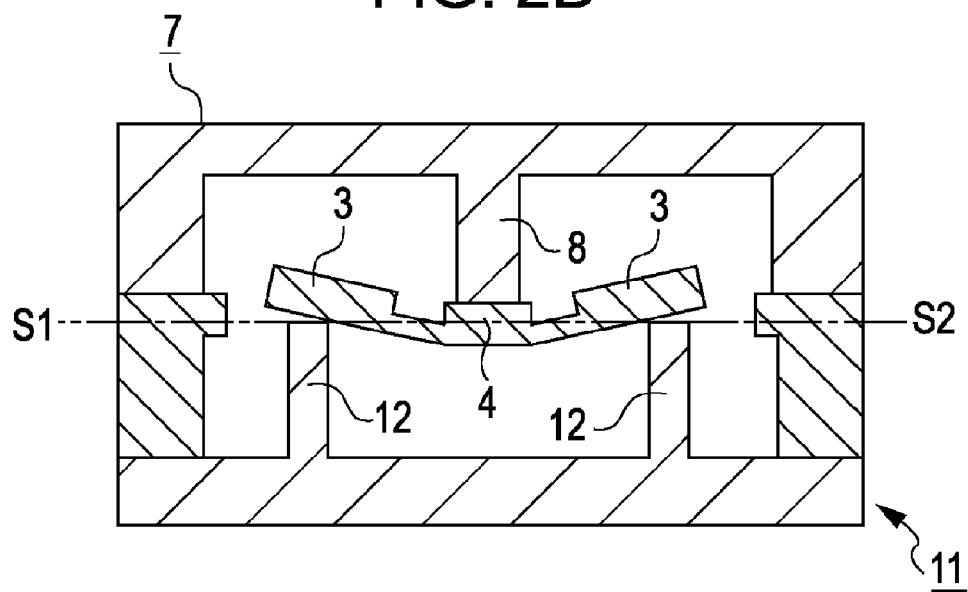

In the step of FIG. 1C, a method of applying an external force to the processing portion 3 may be pressing a mold 11 having a projection 12 to the processing portion 3 as shown in FIGS. 2A and 2B.

Figure 3A:
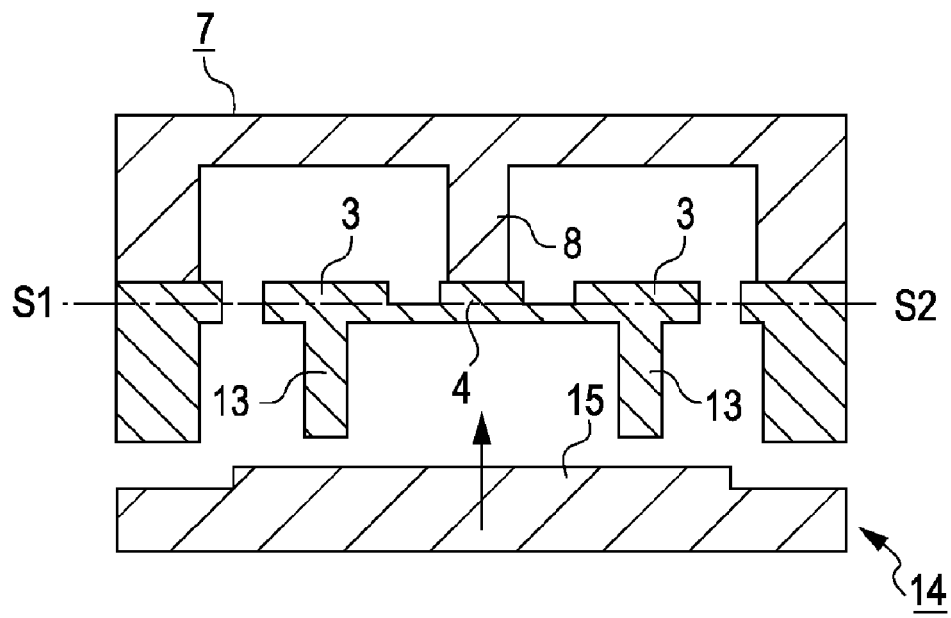
FIGS. 3A and 3B are process diagrams showing the overview of a third example of a method of fabricating a structure according to an embodiment of the invention.
Figure 3B:
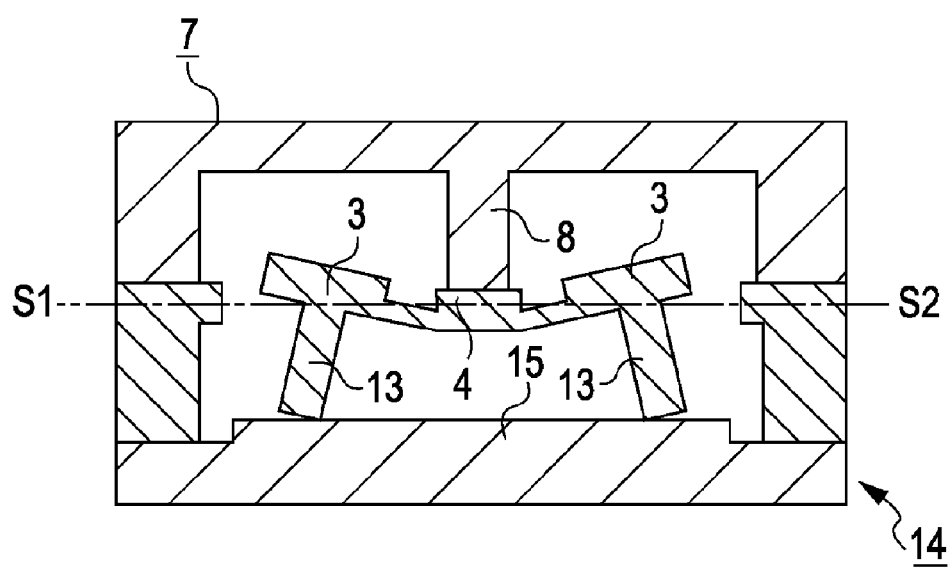

Referring to FIGS. 3A and 3B, a processing portion 3 may have a projection (also referred to as projecting portion) 13, and a mold 14 having a projection 15 may be pressed to the projection 13 of the processing portion 3. A projection or projections may project from either or both of a front surface and a back surface of the principal surface of the processing portion 3 with respect to the principal surface of the movable segment 4, in accordance with an inclining direction.

In the embodiment, the entire restraint segment 7 does not have to be detached from the structure 1. For example, a part of the restraint segment 7 restraining the movable segment 4 may be detached, whereas a part of the restraint segment 7 not affecting the movement of the movable segment 4 (for example, a part of a frame of the restraint segment 7) may be held in a coupled manner to the structure 1. Accordingly, the part of the restraint segment 7 can define a part of the structure 1. The intensity of the structure 1 can be increased.

(First Modification of Restraint Segment)

The form of the restraint segment is not limited to the restraint segment 7 shown in the step of FIG. 1B.

For example, the following five steps (a) to (e) can attain a similar processing result to that of the steps using the restraint segment 7 in FIGS. 1A to 1D.

FIGS. 4A to 4E respectively correspond to steps (a) to (e).

(a) A structure 21 including a movable segment 4 having a projection 22 is fabricated.

The structure 21 has a similar structure to that of the structure 1 shown in the step of FIG. 1A except that the movable segment 4 has the projection 22.

Figure 4A:
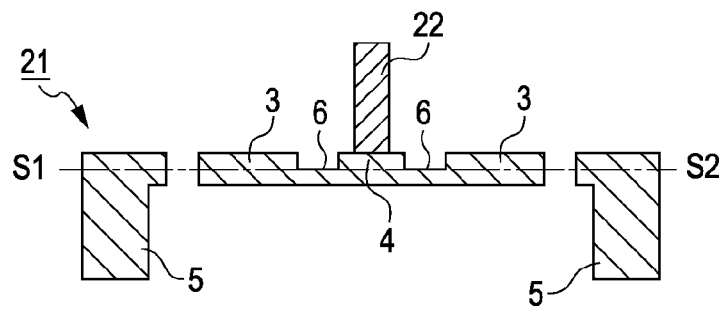
FIGS. 4A to 4E are process diagrams showing the overview of a fourth example of a method of fabricating a structure according to an embodiment of the invention.
Figure 4B:
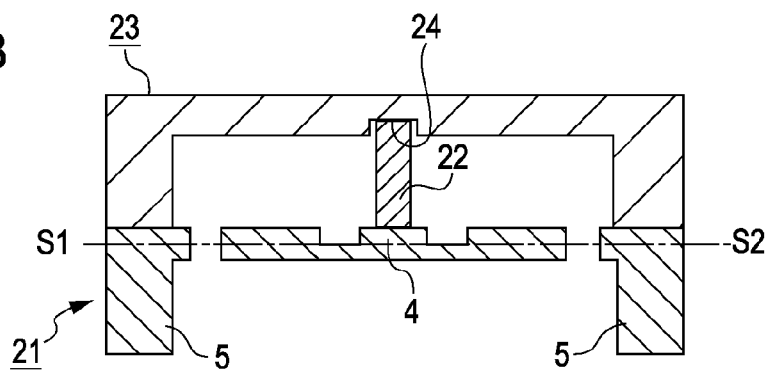
Figure 4C:
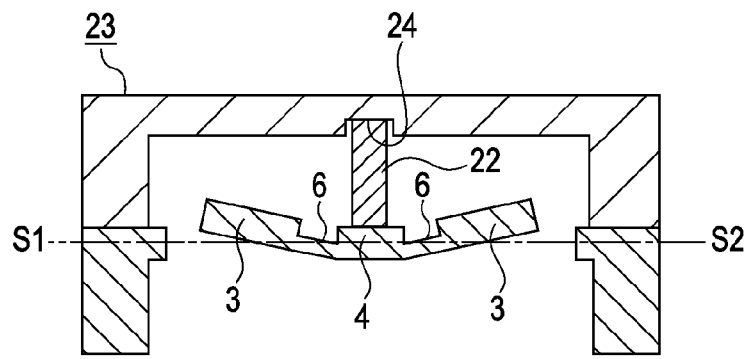
Figure 4D:
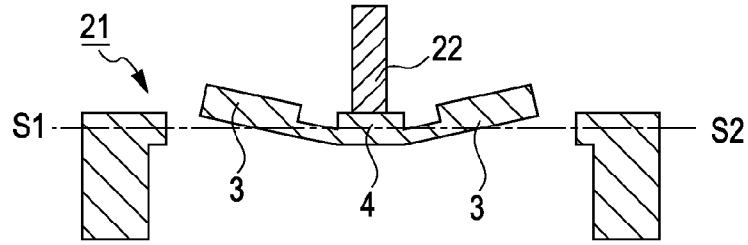

The position of the projection 22 provided at the movable segment 4 may be a side opposite to a side to which an external force is applied to the processing portion 3 in the subsequent step of FIG. 4C, with respect to a principal surface of the movable segment 4.

(b) A restraint segment 23 having a recess 24 is arranged above the structure 21 such that the projection 22 of the movable segment 4 faces the recess 24. That is, the arrangement is exercised such that the projection 22 of the movable segment 4 contacts at least a part of an inner wall (side surface) and a part of a bottom surface of the recess 24 of the restraint segment 23.

(c) The processing portion 3 is plastically deformed by applying an external force to the processing portion 3. The processing portion 3 is inclined with respect to the principal surface of the movable segment 4.

(d) The restraint segment 23 is detached from the structure 21.

(e) The projection 22 of the movable segment 4 is removed from the movable segment 4.

Figure 4E:
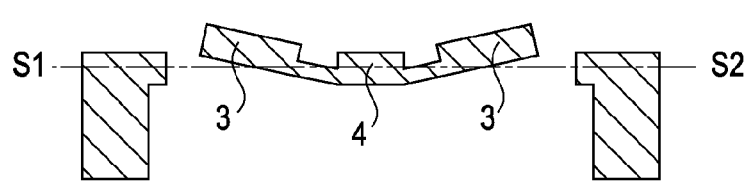

When the movable segment 4 is used as a reflection plate for an optical deflector, the step of FIG. 4E may be carried out and the projection 22 of the movable segment 4 may be removed.

However, the step of FIG. 4E may be omitted and the projection 22 of the movable segment 4 may remain depending on the purpose of use of the movable segment 4.

(Second Modification of Restraint Segment)

Figure 5A:
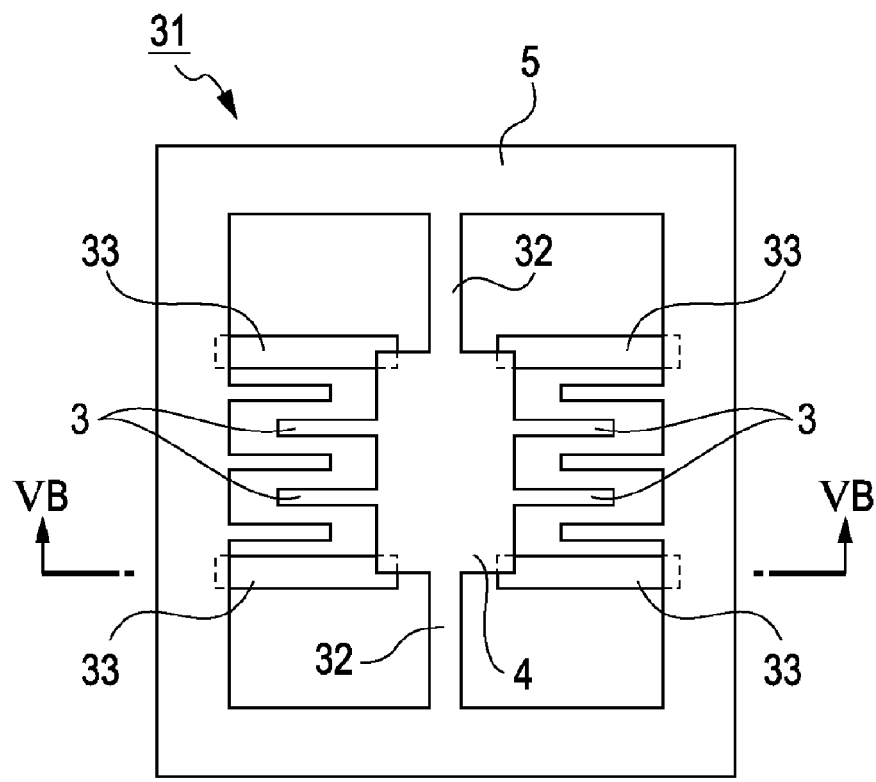
FIGS. 5A and 5B are process diagrams showing the overview of a fifth example of a method of fabricating a structure according to an embodiment of the invention.
Figure 5B:
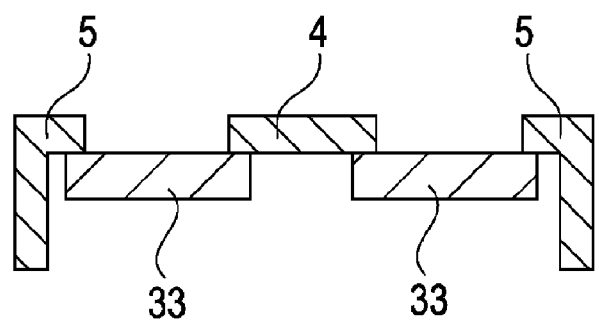

Another modification of the restraint segment may be a restraint segment shown in FIGS. 5A and 5B.

A structure 31 includes a movable segment 4, a processing portion 3, and a support segment 5.

In this modification, the movable segment 4 is coupled to the support segment 5 by a torsion spring 32. The movable segment 4 is freely movable in a plurality of directions although a displacement of the movable segment 4 is restricted.

Referring to FIGS. 5A and 5B, before the processing portion 3 of the structure 31 is inclined, a restraint segment 33 is arranged to bridge across both the movable segment 4 and the support segment 5, and hence the movable segment 4 is fixed.

In this state, the processing portion 3 is inclined as shown in FIG. 1C or FIG. 2C, and then the restraint segment 33 is removed from the movable segment 4 and the support segment 5.

Alternatively, referring to FIGS. 6A and 6B, a restraint segment 33 may be arranged to bridge across the movable segment 4, the torsion spring 32, and the support segment 5.

An effect of the restraint segment in this embodiment will be described below.

Figure 17:
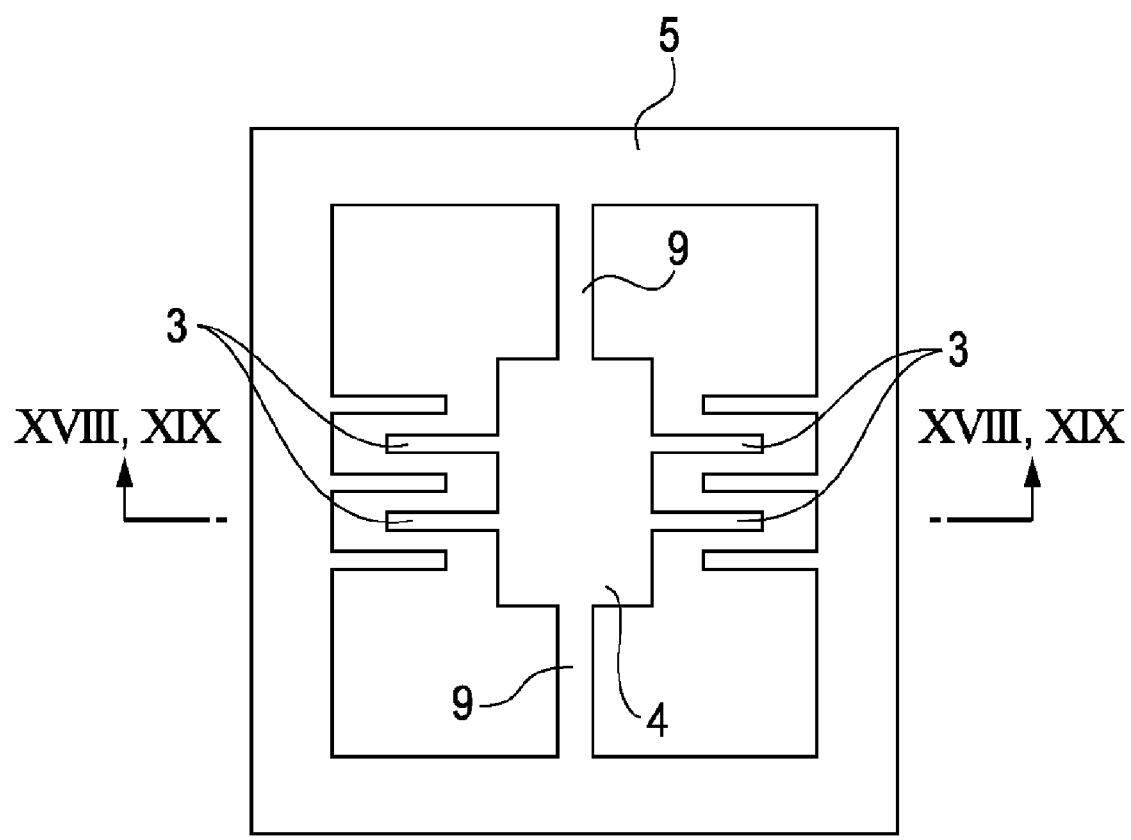
FIG. 17 illustrates an example of a planar structure of the AVC.

In the following description, it is assumed that the movable segment 4 is coupled to the support segment 5 through a torsion spring 9 as shown in FIG. 17.

Figure 18A:
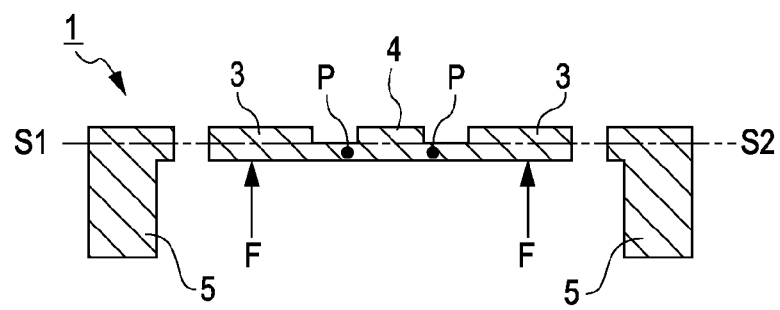
FIGS. 18A to 18D illustrate deformation and displacement of processing portions and a movable segment when an external force is applied to the processing portions at both sides.
Figure 18B:
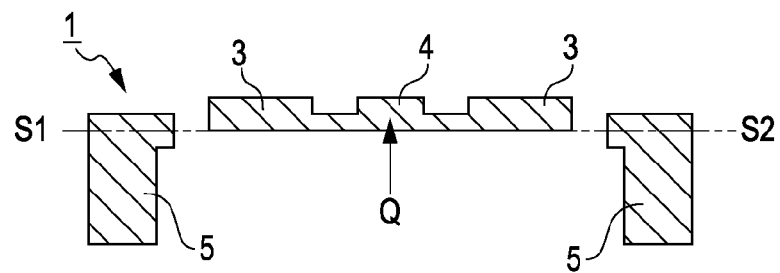
Figure 18C:
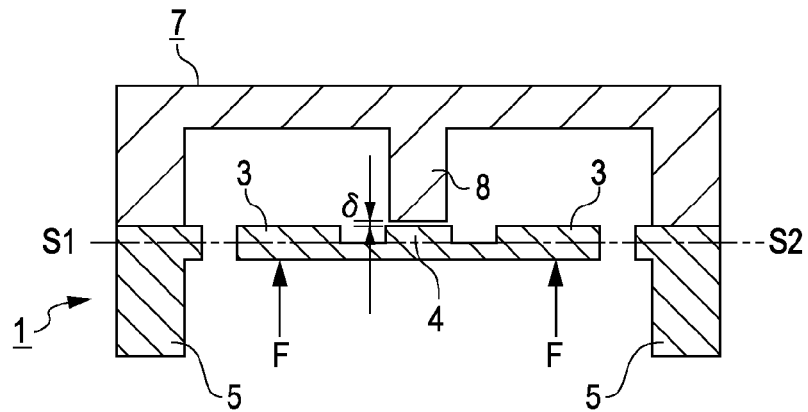

FIGS. 18A to 18D are sectional views taken along line XVIII-XVIII in FIG. 17. Referring to FIGS. 18A to 18C, a case is considered, in which external forces F are applied to processing portions 3 on both sides of the movable segment 4, to incline the processing portions 3.

When design for the structure is limited, it may be occasionally difficult to design a torsion spring 9 so that a flexural rigidity of the torsion spring 9 is sufficiently high with respect to a flexural rigidity of the processing portion 3 at a folding point P.

In this case, when the external forces F are applied without the restraint segment 7 as shown in FIG. 18A, the torsion spring 9 may be deformed in a bending direction. Hence, the movable segment 4 is displaced in a direction indicated by arrow Q in FIG. 18B.

Figure 18D:
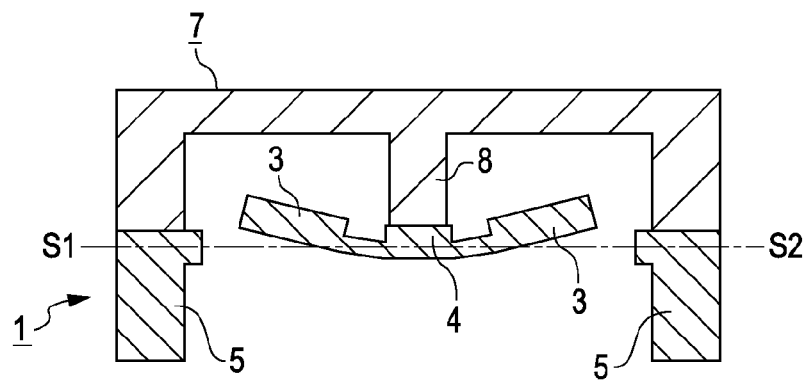

In contrast, when the restraint segment 7 is used as shown in FIG. 18C, the movable segment 4 contacts the projection 8 of the restraint segment 7 as shown in FIG. 18D. Hence, the displacement of the movable segment 4 is limited.

At this time, the displacement of the movable segment 4 is equivalent to a length δ of a gap between a tip end of the projection 8 of the restraint segment 7 and the principal surface of the movable segment 4 immediately before the processing portion 3 is inclined.

Figure 19A:
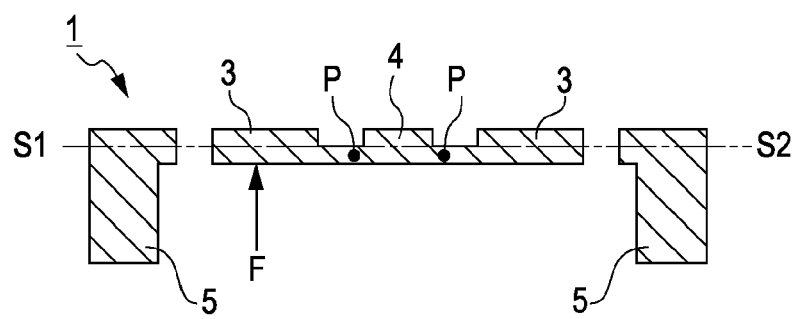
FIG. 19A to 19D illustrate deformation and displacement of a processing portion and a movable segment when an external force is applied to a processing portion at one side.
Figure 19B:
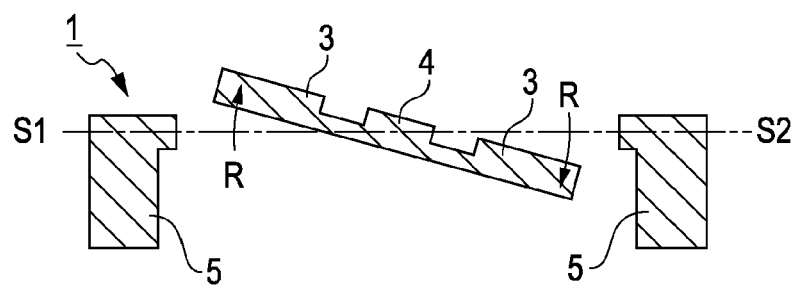
Figure 19C:
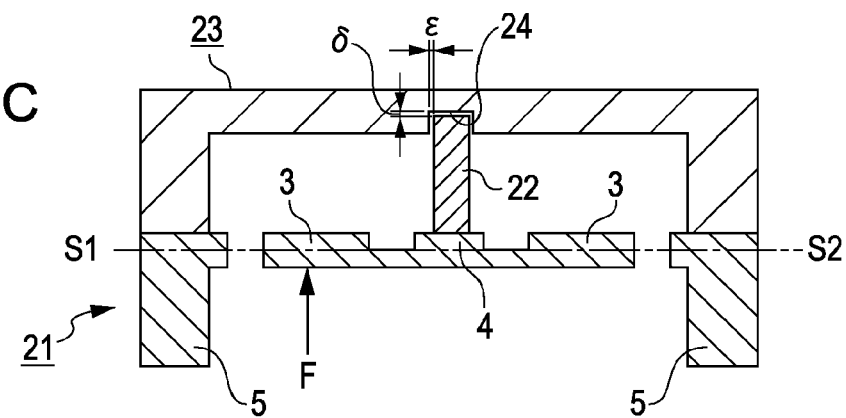

FIGS. 19A to 19D are sectional views taken along line XVIIII-XVIIII in FIG. 17. Referring to FIGS. 19A to 19C, a case is considered, in which an external force F is applied to a processing portion 3 on one side of the movable segment 4, to incline the processing portions 3.

When design for the structure is limited, it may be occasionally difficult to design a torsion spring 9 so that a torsional rigidity of the torsion spring 9 is sufficiently high with respect to a flexural rigidity of the processing portion 3 at a folding point P.

In this case, when the external force F is applied without a restraint segment 23 as shown in FIG. 19A, the torsion spring 9 may be deformed in a torsional direction. Hence, the movable segment 4 is displaced in a direction indicated by arrow R in FIG. 19B.

Figure 19D:
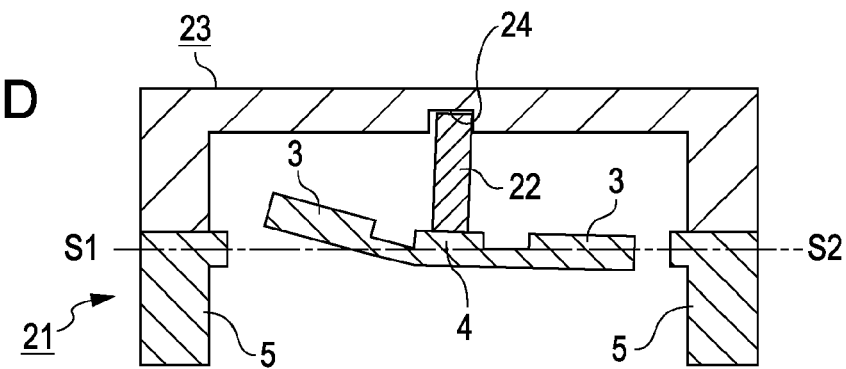
Figure 20A:
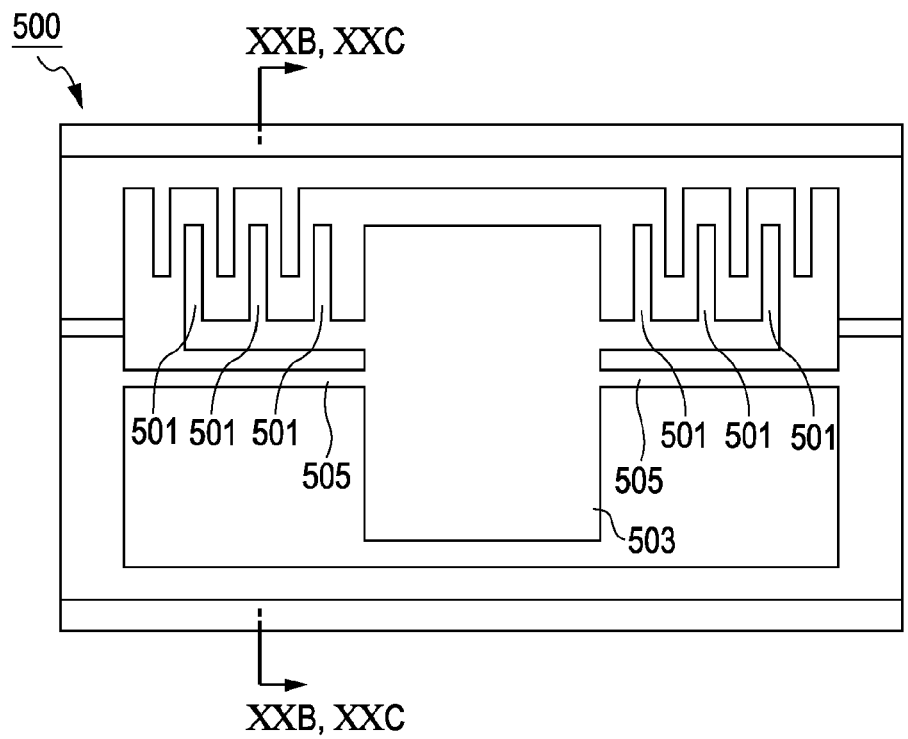
FIGS. 20A to 20C illustrate the overview of an AVC and a method of fabricating the AVC of related art.
Figure 20B:
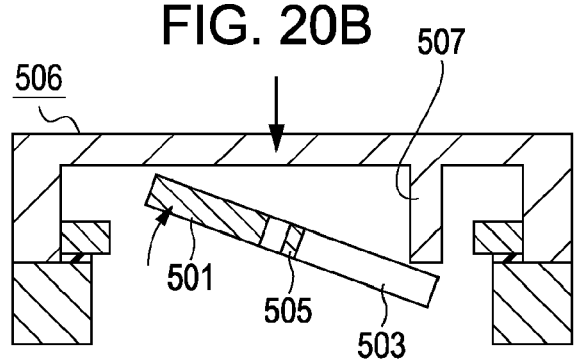
Figure 20C:
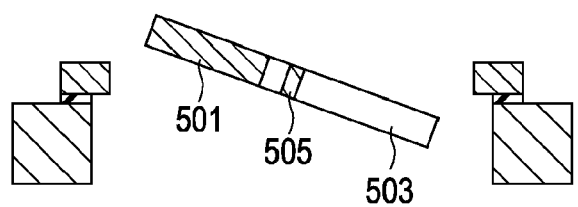

In contrast, when the restraint segment 23 is used as shown in FIG. 19C, the projection 22 of the movable segment 4 contacts the bottom and side surfaces of the recess 24 of the restraint segment 23 as shown in FIG. 19D. Hence, the displacement of the movable segment 4 is limited.

At this time, the displacement of the movable segment 4 depends on a length δ between a tip end of the projection 22 of the movable segment 4 and the bottom surface of the recess 24 of the restraint segment 23 and a length ε between the tip end of the projection 22 and the side surface of the recess 24, immediately before the processing portion 3 is inclined.

Smaller the lengths δ and ε, smaller the displacement of the movable segment 4.

Embodiments

The invention will be described below in more details according to embodiments of the invention. However, the invention is not limited to the embodiments.

First Embodiment

This embodiment describes an example method of fabricating a structure having an inclined segment, which is angled outward with respect to a plane parallel to a principal surface of a movable segment.

It is to be noted that the fabrication method is not limited thereto.

Figure 7A:
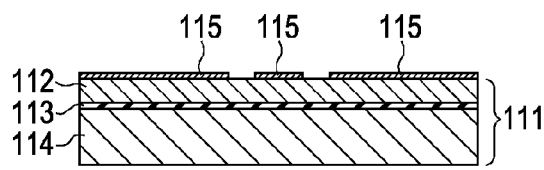
FIGS. 7A to 7O are process diagrams showing a method of fabricating a structure according to a first embodiment of the invention.
Figure 7B:
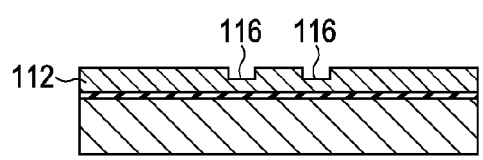
Figure 7C:
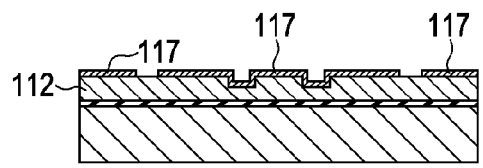
Figure 7D:
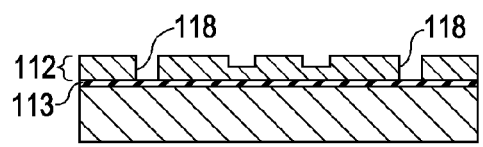
Figure 7E:
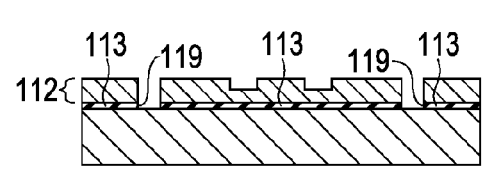
Figure 7F:
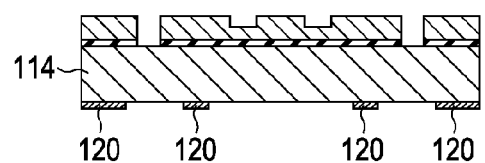
Figure 7G:
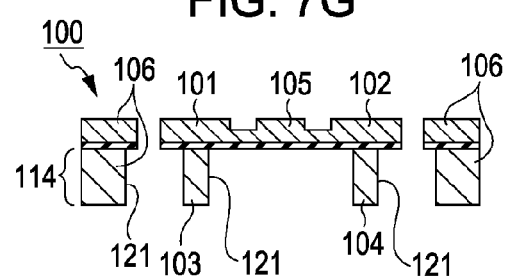
Figure 7H:
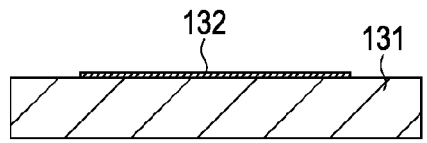
Figure 7L:
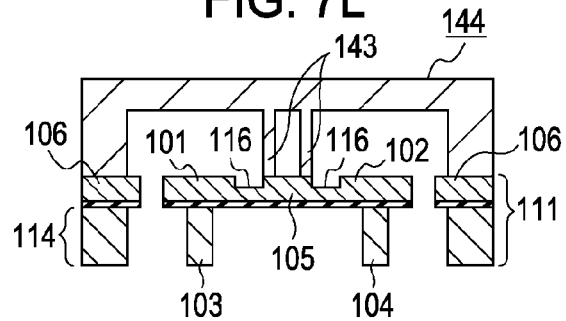
Figure 7I:
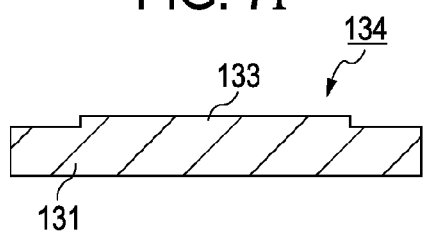
Figure 7M:
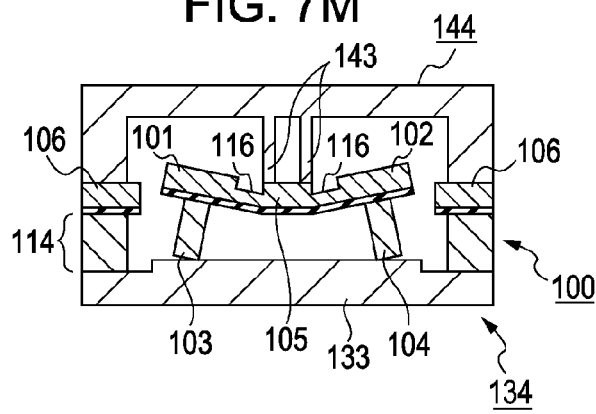
Figure 7J:
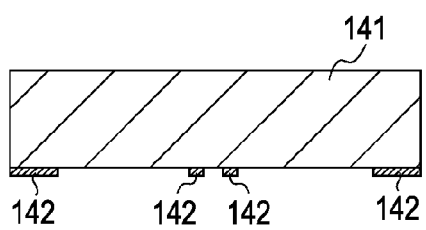
Figure 7N:
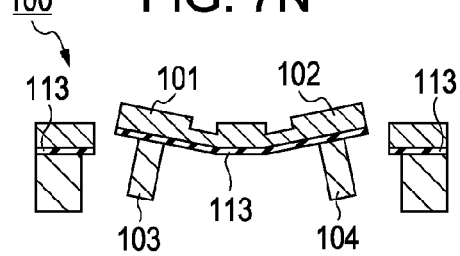
Figure 7K:
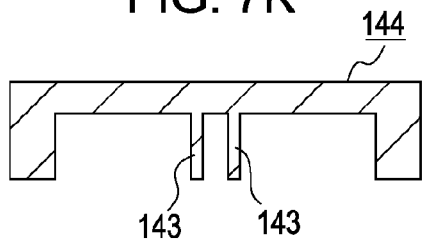
Figure 7O:
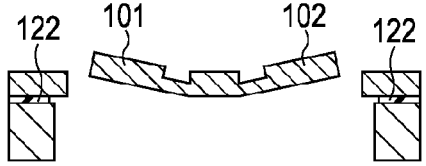

FIGS. 7A to 7O provide process diagrams for the method of fabricating a structure of this embodiment.

FIGS. 7A to 7O respectively correspond to steps (a) to (o) of this embodiment.

In steps (a) to (g), a structure 100, which includes processing portions 101 and 102, projections 103 and 104 of the processing portions 101 and 102, a movable segment 105, and a support segment 106, is fabricated.

(a) A mask layer 115 is formed on a surface of a device layer 112 of a substrate 111.

The substrate 111 has a multilayer structure of three layers. In the specifications, the individual layers are called a device layer, a sacrificial layer, and a support layer, in that order from the upper side.

The substrate 111 may be, for example, a SOI substrate having a structure in which a sacrificial layer 113 made of silicon dioxide is arranged between the two layers (the device layer 112, a support layer 114) made of monocrystalline silicon.

Herein, the term SOI is an abbreviation for silicon on insulator.

(b) A recess 116 is formed in the device layer 112.

At this time, the recess 116 has a depth smaller than a thickness of the device layer 112.

The recess 116 may be formed by vertical etching such as reactive ion etching.

The depth of the recess 116 can be controlled by adjusting a period of etching.

(c) A mask layer 117 is formed on a surface of the device layer 112.

(d) A through hole 118 is formed in the device layer 112.

The through hole 118 may be formed by vertical etching such as reactive ion etching, in a similar manner to the method for forming the recess 116.

When reactive ion etching is used, gas hardly reactive with the sacrificial layer 113 of the substrate 111 is used as etching gas. Hence, the through hole 118 can be reliably formed.

(e) A through hole 119 is formed in the sacrificial layer 113 by using the device layer 112 as a mask.

For example, when a SOI substrate is used as the substrate 111, the sacrificial layer 113 may be selectively etched by using etchant or etching gas, such as hydrofluoric acid or carbon tetrafluoride gas, which is capable of selectively etching silicon dioxide.

(f) A mask layer 120 is formed on a lower surface of the support layer 114.

(g) A through hole 121 is formed in the support layer 114.

Then, in steps (h) and (i), a mold 134 for inclining the processing portions 101 and 102 is fabricated.

(h) A mask layer 132 is formed on a substrate 131.

Regarding that the mold 134 is processed to the substrate 111 and heated, the substrate 131 may be made of a material having a rigidity equivalent to or higher than a rigidity of the material of the substrate 111 and a thermal expansion coefficient close to a thermal expansion coefficient of the material of the device layer 112 of the substrate 111.

For example, when the substrate 111 is a SOI substrate, a substrate made of the same monocrystalline silicon as that of the device layer 112 may be selected as the substrate 131.

(i) A projection 133 of the mold 134 is formed on an upper surface of the substrate 131.

The projection 133 of the mold 134 may be formed by etching the periphery of the projection 133 of the mold 134.

The periphery of the projection 133 of the mold 134 may be etched by a similar method to that for forming the recess 116 in the step of FIG. 7B.

Then, in steps (j) and (k), a restraint segment 144 for restricting movement of the movable segment 105 is fabricated.

(j) A mask layer 142 is formed on a substrate 141.

The substrate 141 may be made of a material having a rigidity equivalent to or higher than a rigidity of the material of the substrate 111 and a thermal expansion coefficient close to a thermal expansion coefficient of the material of the device layer 112 of the substrate 111, for the same reason as that of the substrate 131.

For example, when the substrate 111 is a SOI substrate, a substrate made of the same monocrystalline silicon as that of the device layer 112 may be selected as the substrate 141.

(k) A projection 143 of the restraint segment 144 is formed on a lower surface of the substrate 141.

A plurality of projections 143 may be provided as shown in FIG. 7K, or a single projection may be provided as shown in FIG. 1B.

The projection 143 of the restraint segment 144 may be formed by a similar method to that for forming the projection 133 of the mold 134 in the step of FIG. 7I.

Finally, in steps (i) to (o), elevation angles are applied to the processing portions 101 and 102 while the movement of the movable segment 105 is restricted. Then, the projections 103 and 104 of the processing portions 101 and 102 are removed.

(l) The restraint segment 144 is arranged at the structure 100 such that the tip end of the projection 143 of the restraint segment 144 faces the movable segment 105.

The restraint segment 144 is arranged at a side of the structure 100 at which the processing portions 101 and 102 are inclined and project with respect to the principal surface of the movable segment 105.

At this time, the tip end of the projection 143 of the restraint segment 144 may contact the principal surface of the movable segment 105.

When the tip end of the projection 143 of the restraint segment 144 does not contact the principal surface of the movable segment 105, the arrangement of the restraint segment 144 may be adjusted so that the tip end of the projection 143 of the restraint segment 144 contacts the principal surface of the movable segment 105 in the subsequent step of FIG. 7M.

The restraint segment 144 may be fixed to the structure 100 by pinching the restraint segment 144 and the structure 100 from outside with a clamper or the like, or by bonding the restraint segment 144 and the structure 100 with an adhesive or by other way of bonding.

In particular, when the substrate 111 is a SOI substrate, a silicon dioxide layer may be formed on the surface of the restraint segment 144. Hence, the restraint segment 144 and the structure 100 may be bonded with each other by anode bonding.

(m) The recess 116 of the device layer 112 is heated, and the mold 134 is pressed to the projections 103 and 104 of the processing portions 101 and 102, thereby plastically deforming the recess 116.

When the substrate 111 is a SOI substrate, for example, a heating temperature may be at least 600° C. necessary for plastic deformation of silicon.

For example, the heating method may be a method of locally heating the recess 116 and the periphery thereof with joule heat generated when current flows through a current path extending through the periphery of the recess 116.

The current path may be formed by depositing, for example, a semiconductor film with a sufficiently high melting point through a certain insulating film. Alternatively, when the device layer 112 is conductive, the current path may use the device layer 112.

For another heating method, a proper furnace may be used and the structure 100, the restraint segment 144, and the mold 134 may be entirely heated while the mold 134 is continuously pressed to the projections 103 and 104 of the processing portions 101 and 102, to heat the recess 116 of the device layer 112.

The mold 134 may be continuously pressed to the projections 103 and 104 of the processing portions 101 and 102 by a similar method to that for fixing the restraint segment 144 to the structure 100 in the step of FIG. 7L.

(n) Cooling is conducted, and then the mold 134 and the restraint segment 144 are detached from the structure 100.

(o) A part of the sacrificial layer 113 not occupied by a sacrificial layer 122 is removed, and the projections 103 and 104 of the processing portions 101 and 102 are removed.

The projections 103 and 104 of the processing portions 101 and 102 are fixed to the processing portions 101 and 102 only via the projections 103 and 104. Hence, in this step, the projections 103 and 104 are removed with the sacrificial layer 113.

For example, when a SOI substrate is used as the substrate 111, the sacrificial layer 113 may be removed by isotropic etching for silicon dioxide by using etchant or etching gas, such as hydrofluoric acid or carbon tetrafluoride.

At this time, by adjusting a period of etching, the part of the sacrificial layer 122 can remain while the sacrificial layer 113 near the projections 103 and 104 of the processing portions 101 and 102 are removed.

FIG. 15 shows an example structure fabricated by the fabricating method of this embodiment.

FIG. 15 illustrates a vibration structure using an AVC having movable combs 171 and 173 serving as a plurality of processing portions inclined upward with respect to a principal surface of a board 175 serving as a movable segment.

A voltage signal source 178, whose voltage changes with a waveform such as pulse or sine wave, is connected to the movable comb 171 and a fixed comb 172. Thus, the board 175 can vibrate in a rotation direction around a torsion spring 177.

Alternatively or additionally, a voltage signal source 179 may be connected to the movable comb 173 and a fixed comb 174. Thus, the board 175 may vibrate in the rotation direction around the torsion spring 177.

Second Embodiment

This embodiment describes another example method of fabricating a structure having an inclined segment, which is angled outward with respect to a principal surface of a movable segment.

Figure 8A:
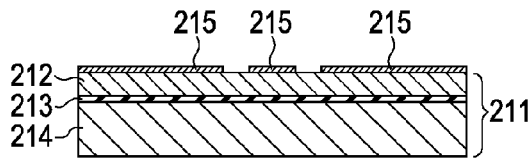
FIGS. 8A to 8R are process diagrams showing a method of fabricating a structure according to a second embodiment of the invention.
Figure 8G:
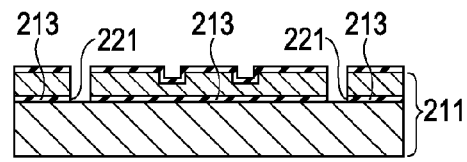
Figure 8B:
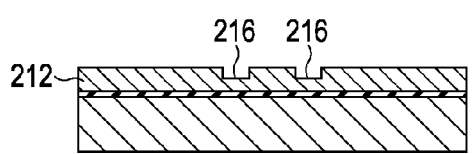
Figure 8H:
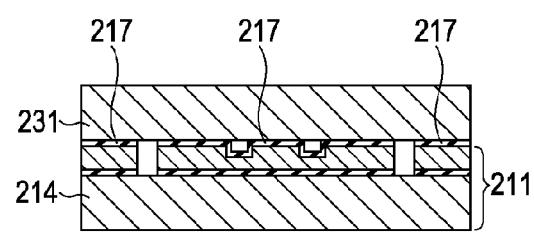
Figure 8C:
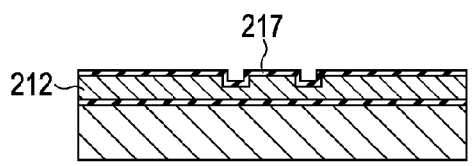
Figure 8D:
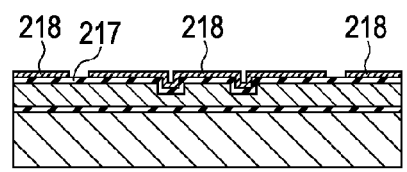
Figure 8I:
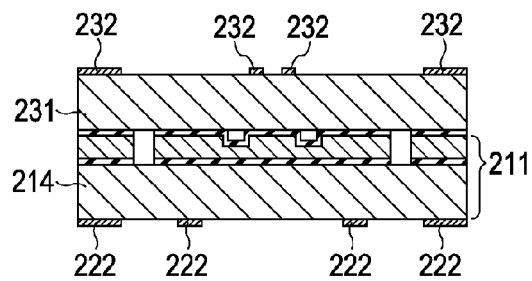
Figure 8E:
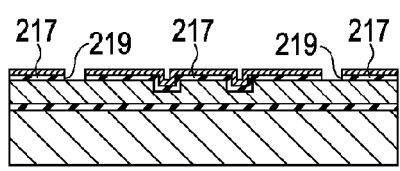
Figure 8J:
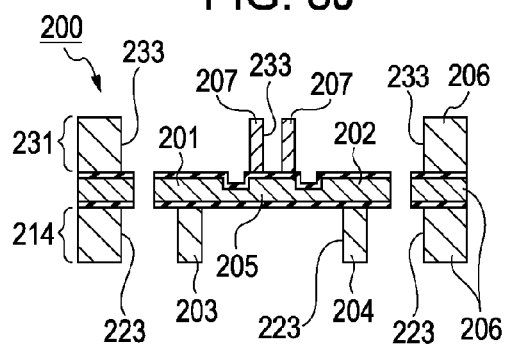
Figure 8F:
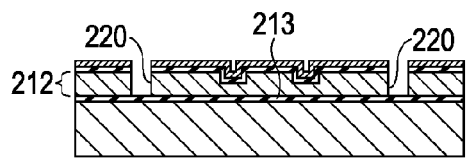
Figure 8K:
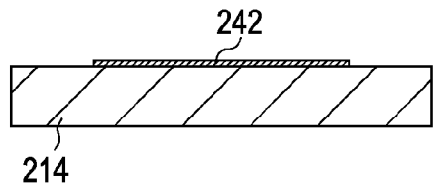
Figure 8L:
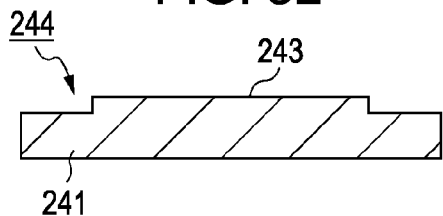
Figure 8M:
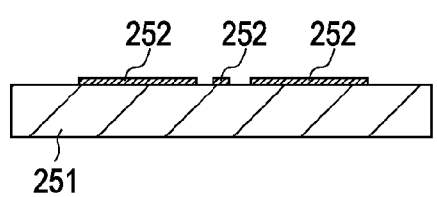
Figure 8N:
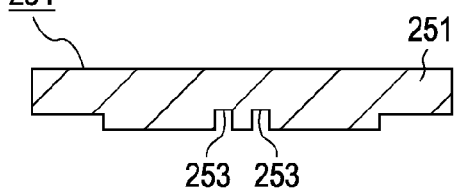
Figure 8O:
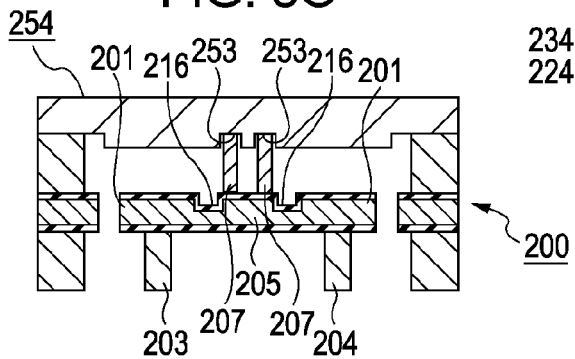
Figure 8P:
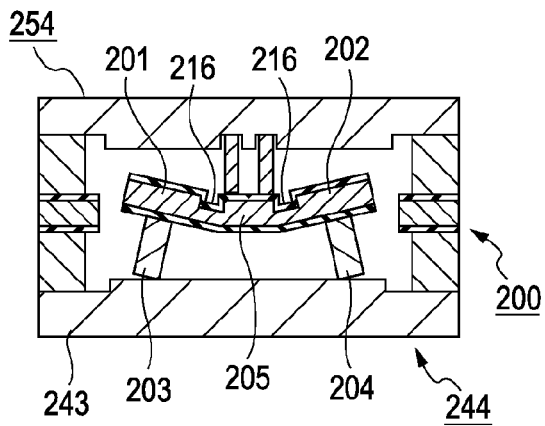
Figure 8Q:
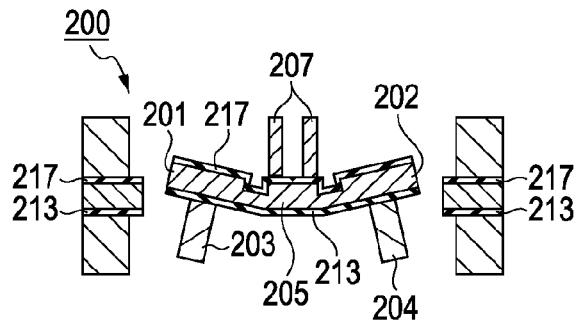
Figure 8R:
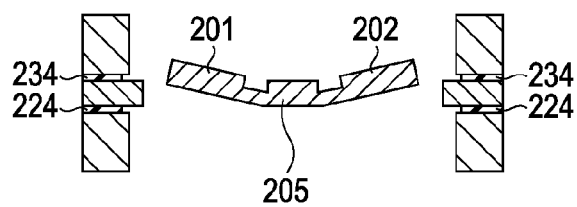

FIGS. 8A to 8R provide process diagrams for the method of fabricating a structure of this embodiment.

FIGS. 8A to 8R respectively correspond to steps (a) to (r) of this embodiment.

In steps (a) to (j), a structure 200, which includes processing portions 201 and 202 before inclination, projections 203 and 204 of the processing portions 201 and 202, a movable segment 205, a support segment 206, and a projection 207 of the support segment 206, is fabricated.

(a) A mask layer 215 is formed on a surface of a device layer 212 of a substrate 211.

The substrate 211 has a three-layer structure (the device layer 212, a sacrificial layer 213, a support layer 214) in a similar manner to the substrate 111 used in the step of FIG. 7A. For example, the substrate 111 may use a SOI substrate.

(b) A recess 216 is formed in the device layer 212.

At this time, the recess 216 has a depth smaller than a thickness of the device layer 212.

The recess 216 may be formed by a similar method to that for forming the recess 116 in the step of FIG. 7B.

(c) A sacrificial layer 217 is formed on a surface of the device layer 212.

The sacrificial layer 217 may be formed by depositing a material such as silicon oxide, so that the sacrificial layer 217 is deposited in a thin-film form.

(d) A mask layer 218 is formed on an upper surface of the sacrificial layer 217.

(e) A through hole 219 is formed in the sacrificial layer 217.

The through hole 219 may be formed by a similar method to that for forming the through hole 119 in the step of FIG. 7E.

(f) A through hole 220 is formed in the device layer 212 by using the sacrificial layer 217 as a mask.

The through hole 220 may be formed by a similar method to that for forming the through hole 118 in the step of FIG. 7D.

(g) A through hole 221 is formed in the sacrificial layer 213 of the substrate 211.

(h) A substrate 231 is bonded on an upper surface of the sacrificial layer 217.

The substrate 231 may be the same substrate as that of the support layer 214 of the substrate 211.

For example, when the substrate 211 is an SOI substrate, the substrate 231 may be a substrate made of monocrystalline silicon.

When the substrate 231 is a monocrystalline silicon substrate, anode bonding may be used as the bonding method.

(i) A mask layer 232 is formed on an upper surface of the substrate 231, and a mask layer 222 is formed on a lower surface of the support layer 214 of the substrate 211.

(j) A through hole 233 is formed in the substrate 231, and a through hole 223 is formed in the support layer 214.

In this process, the projection 207 is formed at the movable segment 205. A plurality of projections 207 may be provided at the movable segment 205 as shown in FIG. 8J, or a single projection may be provided at the movable segment as shown in FIG. 4A.

Then, in steps (k) and (l), a mold 244 for inclining the processing portions 201 and 202 is fabricated.

(k) A mask layer 242 is formed on a substrate 241.

The substrate 241 may be made of a material having a rigidity equivalent to or higher than a rigidity of the material of the substrate 211 and a thermal expansion coefficient close to a thermal expansion coefficient of the material of the device layer 212 of the substrate 211, for the same reason as that in the step of FIG. 7H.

For example, when the substrate 211 is a SOI substrate, a substrate made of the same monocrystalline silicon as that of the device layer 212 may be selected as the substrate 241.

(l) A projection 243 of the mold 244 is formed on an upper surface of the substrate 241.

The projection 243 of the mold 244 may be formed by a similar method to that for forming the projection 133 of the mold in the step of FIG. 7I.

Then, in steps (m) and (n), a restraint segment 254 for restricting movement of the movable segment 205 is fabricated.

(m) A mask layer 252 is formed on a substrate 251.

The substrate 251 may be made of a material having a rigidity equivalent to or higher than a rigidity of the material of the substrate 211 and a thermal expansion coefficient close to a thermal expansion coefficient of the material of the device layer 212 of the substrate 211, for the same reason as that in the step of FIG. 7H.

For example, when the substrate 211 is a SOI substrate, a substrate made of the same monocrystalline silicon as that of the device layer 212 may be selected as the substrate 251.

(n) A recess 253 of the restraint segment 254 is formed on a lower surface of the substrate 251.

The number and position of recesses 253 of the restraint segment 254 are formed to correspond to the number and position of projections 207 of the movable segment 205 in FIG. 8J.

The recess 253 of the restraint segment 254 may be formed by a similar method to that for forming the recess 116 of the device layer 212 in the step of FIG. 7B.

Finally, in steps (o) to (r), elevation angles are applied to the processing portions 201 and 202 while the movement of the movable segment 205 is restricted. Then, the projections 203 and 204 of the processing portions 201 and 202 are removed.

(o) The restraint segment 254 is arranged at the structure 200 such that the recess 253 of the restraint segment 254 faces the tip end of the projection 207 of the movable segment 205.

The restraint segment 254 is arranged at a side of the structure 200 at which the processing portions 201 and 202 are inclined and project out the principal surface of the movable segment 205.

At this time, the tip end of the projection 207 of the movable segment 205 may contact an inner wall (side surface) or a bottom surface of the recess 253 of the restraint segment 254.

If the tip end of the projection 207 of the movable segment 205 is not in contact with the side surface or the bottom surface of the recess 253 of the restraint segment 254, the position of the restraint segment 254 may be aligned such that the tip end of the projection 207 contacts the side surface or the bottom surface of the recess 253, in the subsequent step of FIG. 8P.

The restraint segment 254 may be fixed to the structure 200 by pinching the restraint segment 254 and the structure 200 from outside with a clamper or the like, or by bonding the restraint segment 254 and the structure 200 with an adhesive or by other way of bonding.

In particular, when the substrate 211 is a SOI substrate, or when the substrate 231 is a monocrystalline silicon substrate, a silicon dioxide layer may be formed on the surface of the restraint segment 254. Hence, the restraint segment 254 and the structure 200 may be bonded with each other by anode bonding.

(p) The recess 216 of the device layer 212 is heated, and the mold 244 is pressed to the projections 203 and 204 of the processing portions 201 and 202, thereby plastically deforming the recess 216.

When the substrate 211 is a SOI substrate, for example, a heating temperature may be at least 600° C. necessary for plastic deformation of silicon.

For example, the heating method may be a method of locally heating the recess 216 and the periphery thereof with joule heat generated when current flows through a current path extending through the periphery of the recess 216.

The current path may be formed by depositing, for example, a semiconductor film with a sufficiently high melting point through a certain insulating film. Alternatively, when the device layer 212 is conductive, the current path may use the device layer 212.

For another heating method, a proper furnace may be used and the structure 200, the restraint segment 254, and the mold 244 may be entirely heated while the mold 244 is continuously pressed to the projections 203 and 204 of the processing portions 201 and 202, to heat the recess 216 of the device layer 212.

The mold 244 may be continuously pressed to the projections 203 and 204 of the processing portions 201 and 202 by a similar method to that for fixing the restraint segment 254 to the structure 200 in the step of FIG. 8O.

(q) Cooling is conducted, and then the mold 244 and the restraint segment 254 are detached from the structure 200.

(r) Parts of the sacrificial layers 213 and 217 not occupied by sacrificial layers 224 and 234 are removed. The projections 203 and 204 of the processing portions 201 and 202, and the projection 207 of the movable segment 205 are removed.

The projections 203 and 204 of the processing portions 201 and 202, and the projection 207 of the movable segment 205 are fixed to the processing portions 201 and 202, and the movable segment 205 only via the sacrificial layers 213 and 217.

Thus, in this step, the projections 203 and 204 of the processing portions 201 and 202, and the projection 207 of the movable segment 205 are removed with the sacrificial layers 213 and 217.

The sacrificial layer 213 may be removed by a similar method to that in the step of FIG. 7O.

Third Embodiment

This embodiment describes another example method of fabricating a structure having an inclined segment, which is angled outward with respect to a plane parallel to a principal surface of a substrate.

Figure 9A:
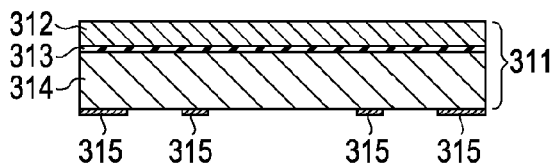
FIGS. 9A to 9N are process diagrams showing a method of fabricating a structure according to a third embodiment of the invention.
Figure 9F:
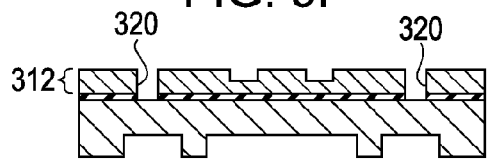
Figure 9B:
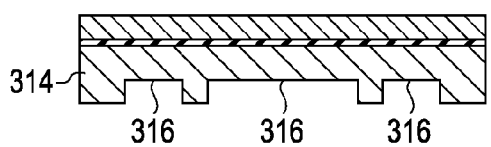
Figure 9G:
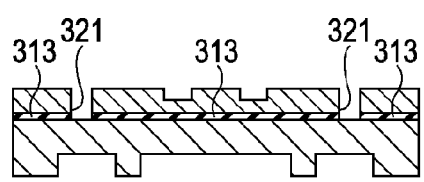
Figure 9C:
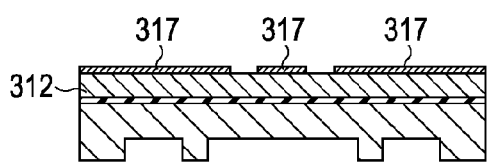
Figure 9H:
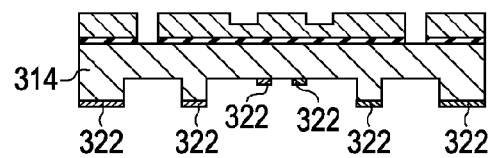
Figure 9D:
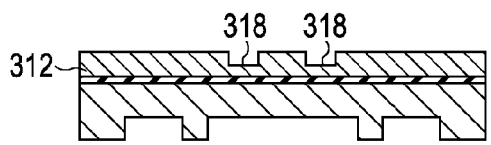
Figure 9E:
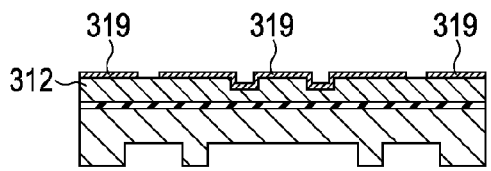
Figure 9I:
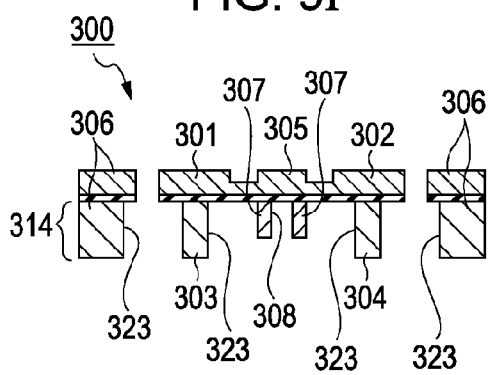
Figure 9J:
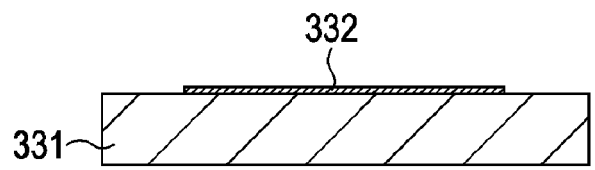
Figure 9K:
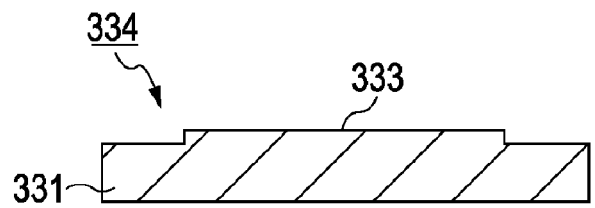
Figure 9L:
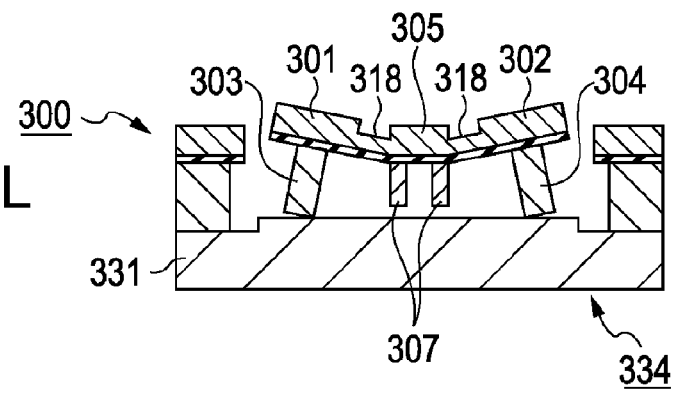
Figure 9M:
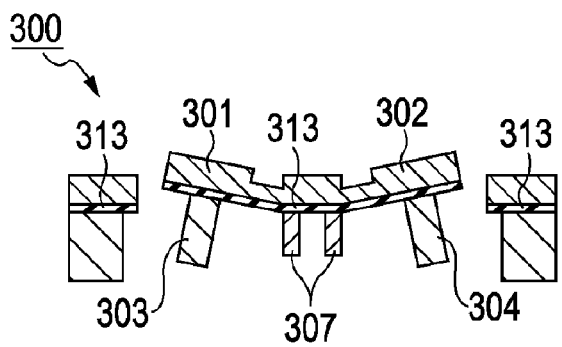
Figure 9N:
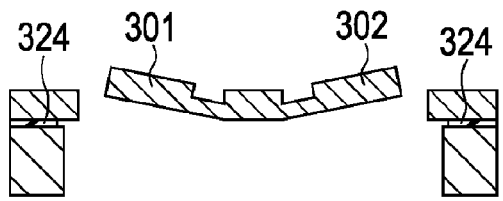

FIGS. 9A to 9N provide process diagrams for the method of fabricating a structure of this embodiment.

FIGS. 9A to 9N respectively correspond to steps (a) to (n) of this embodiment.

In steps (a) to (i), a structure 300, which includes processing portions 301 and 302, projections 303 and 304 of the processing portions 301 and 302, a movable segment 305, a support segment 306, and a restraint segment 307, is fabricated.

(a) A mask layer 315 is formed on a surface of a support layer 314 of a substrate 311.

The substrate 311 has a three-layer structure (a device layer 312, a sacrificial layer 313, the support layer 314) in a similar manner to the substrate 111 used in the step of FIG. 7A. For example, the substrate 111 may use a SOI substrate.

(b) A recess 316 is formed in the support layer 314.

The depth of the recess 316 corresponds to a value obtained by subtracting a thickness of the restraint segment 307 from a thickness of the support layer 314.

The recess 316 may be formed by a similar method to that for forming the recess 116 in the step of FIG. 7B.

(c) A mask layer 317 is formed on the device layer 312.

(d) A recess 318 is formed in the device layer 312.

At this time, the recess 318 has a depth smaller than a thickness of the device layer 312.

(e) A mask layer 319 is formed on the device layer 312.

(f) A through hole 320 is formed in the device layer 312.

The through hole 320 may be formed by a similar method to that for forming the through hole 118 in the step of FIG. 7D.

(g) A through hole 321 is formed in the sacrificial layer 313 by using the device layer 312 as a mask.

The through hole 321 may be formed by a similar method to that for forming the through hole 119 in the step of FIG. 7E.

(h) A mask layer 322 is formed on the support layer 314.

(i) Through holes 308 and 323 are formed in the support layer 314.

Figure 10A:
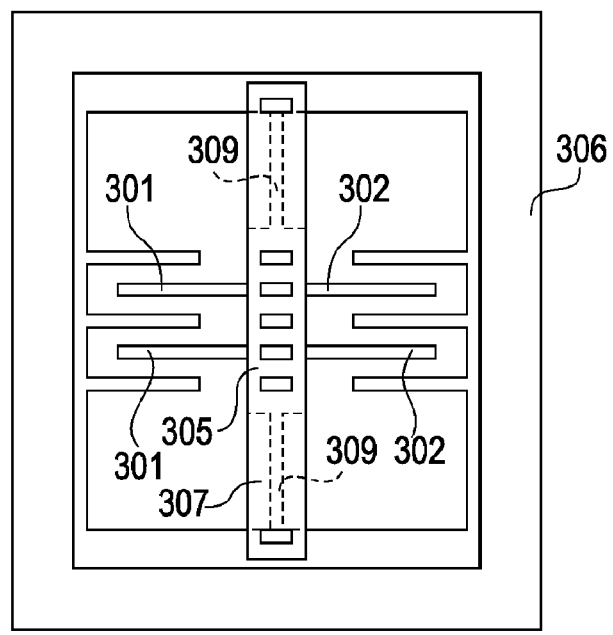
FIGS. 10A and 10B illustrate an arrangement position and a shape of a restraint segment according to the third embodiment of the invention.
Figure 10B:
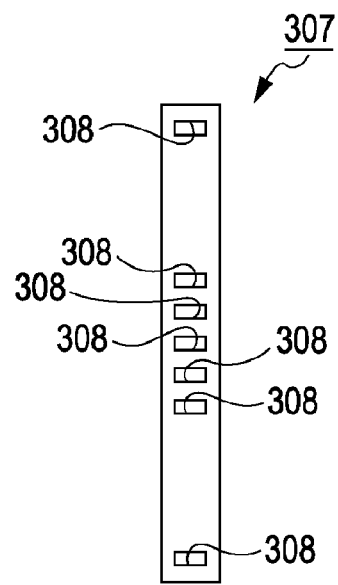

The through hole 308 is formed at a part of an area of the restraint segment 307 located directly below the movable segment 305 as shown in FIGS. 10A and 10B.

This allows the sacrificial layer 313 close to the restraint segment 307 to be removed in a short period when the restraint segment 307 is removed in the subsequent step of FIG. 9N.

Then, in steps (j) and (k), a mold 334 for inclining the processing portions 301 and 302 is fabricated.

(j) A mask layer 332 is formed on a substrate 331.

The substrate 331 may be made of a material having a rigidity equivalent to or higher than a rigidity of the material of the substrate 311 and a thermal expansion coefficient close to a thermal expansion coefficient of the material of the device layer 312 of the substrate 311, for the same reason as that in the step of FIG. 7H.

For example, when the substrate 311 is a SOI substrate, a substrate made of the same monocrystalline silicon as that of the device layer 312 may be selected as the substrate 331.

(k) A projection 333 of the mold 334 is formed on an upper surface of the substrate 331.

The projection 333 of the mold 334 may be formed by a similar method to that for forming the projection 133 of the mold 134 in the step of FIG. 7I.

Finally, in steps (l) to (n), elevation angles are applied to the processing portions 301 and 302. Then, the projections 303 and 304 of the processing portions 301 and 302, and the restraint segment 307 are removed.

(l) The recess 318 of the device layer 312 is heated, and the mold 334 is pressed to the projections 303 and 304 of the processing portions 301 and 302, thereby plastically deforming the recess 318.

This process can be carried out in a similar manner to that of the step of FIG. 7M.

(m) Cooling is conducted, and then the mold 334 is detached from the structure 300.

(n) A part of the sacrificial layer 313 not occupied by a sacrificial layer 324 is removed, and the projections 303 and 304 of the processing portions 301 and 302, and the restraint segment 307 are removed.

The projections 303 and 304 of the processing portions 301 and 302, and the restraint segment 307 are fixed to the processing portions 301 and 302, and the movable segment 305 only via the sacrificial layer 313.

Thus, in this step, the projections 303 and 304 of the processing portions 301 and 302, and the restraint segment 307 are removed with the sacrificial layer 313.

The sacrificial layer 313 may be removed by a similar method to that in the step of FIG. 7O.

Another method of fabricating a structure 300, which includes processing portions 301 and 302, projections 303 and 304 of the processing portions 301 and 302, a movable segment 305, a support segment 306, and a restraint segment 307, will be described below with reference to FIGS. 11A to 11D.

Figure 11A:
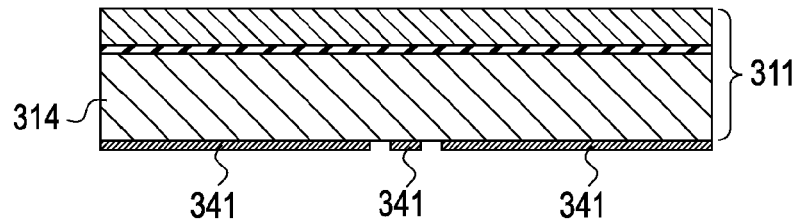
FIGS. 11A to 11D are process diagram partly showing another method of fabricating a structure according to the third embodiment of the invention.
Figure 11B:
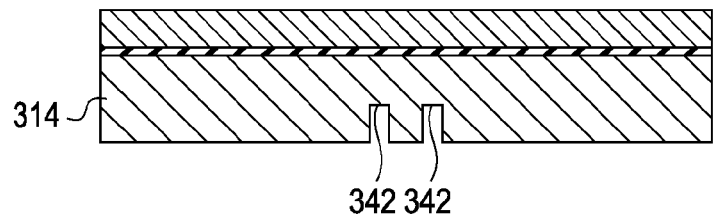

A mask layer 341 is formed on a support layer 314 of a substrate 311 as shown in FIG. 11A. A recess 342 is formed in the support layer 314 as shown in FIG. 11B.

Then, a recess 318 and a through hole 320 are formed in a device layer 312, and a through hole 321 is formed in a sacrificial layer 313, in a similar manner to that in the steps of FIGS. 9C to 9G.

Figure 11C:
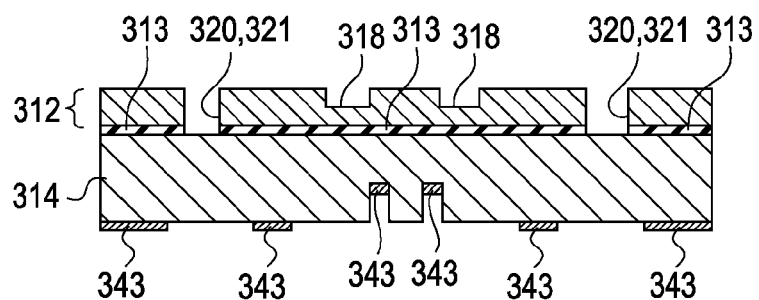
Figure 11D:
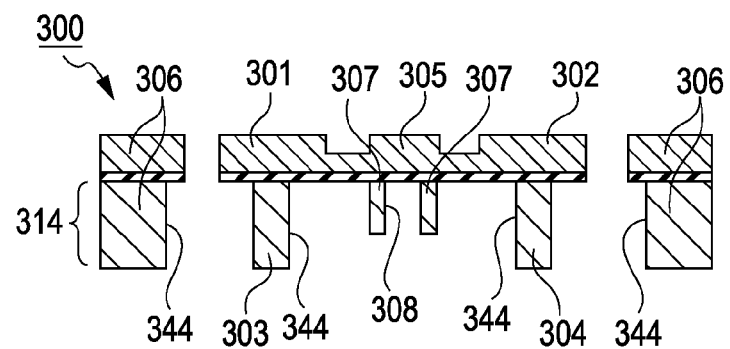

A mask layer 343 is formed on the support layer 314 as shown in FIG. 11C. A through hole 344 is formed in the support layer 314 as shown in FIG. 11D.

Fourth Embodiment

When a structure has a plurality of processing portions, the plurality of processing portions may be processed to simultaneously achieve different angles by partly modifying the steps of one of the first to third embodiments.

This embodiment provides two modification methods based on the fabricating method described in the first embodiment.

Figure 12A:
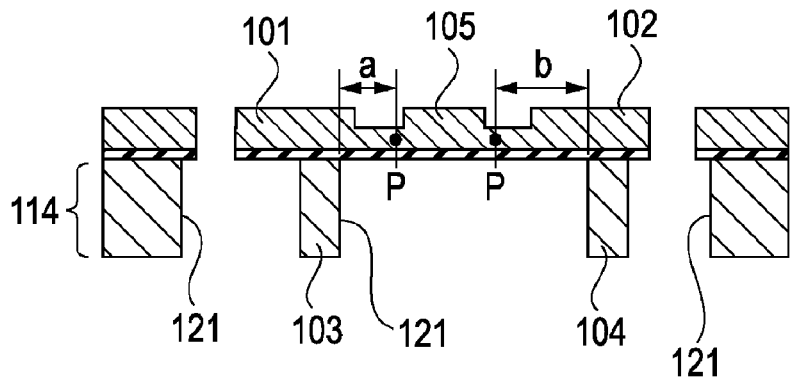
FIGS. 12A to 12C are process diagrams showing the overview of a first example method of fabricating a structure according to a fourth embodiment of the invention.

In a first method, referring to FIG. 12A, projections 103 and 104 of processing portions 101 and 102 are arranged at different distances (distances a and b) from reference points P for bending the processing portions 101 and 102.

Such projections 103 and 104 of the processing portions 101 and 102 may be formed by changing the area in which the mask layer 120 is formed in the step of FIG. 7F and by changing the area in which the through hole 121 is formed in the step of FIG. 7G.

Figure 12B:
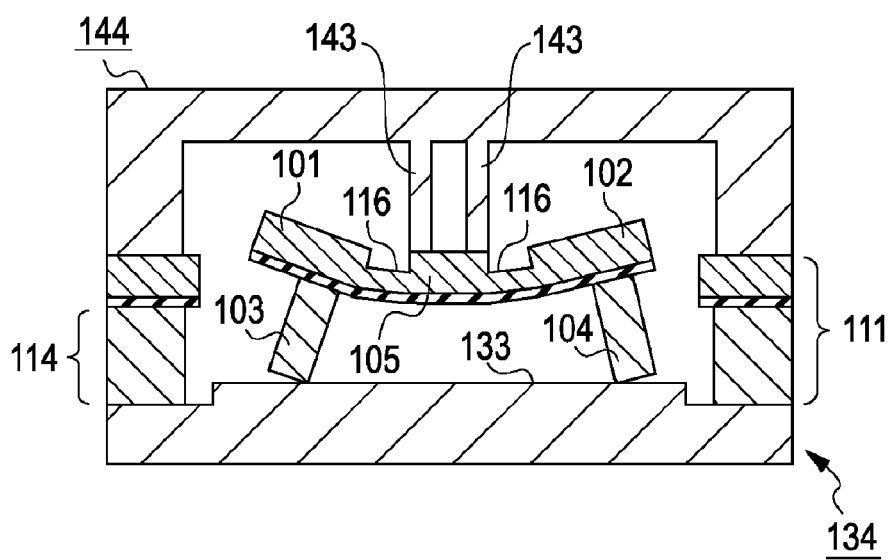
Figure 12C:
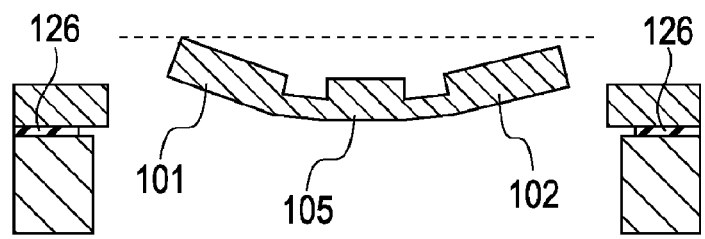

FIG. 12B shows the appearance when the mold 134 is pressed to the support layer 114 and the projections 103 and 104 of the processing portions 101 and 102. FIG. 12C shows the finished state.

Figure 13A:
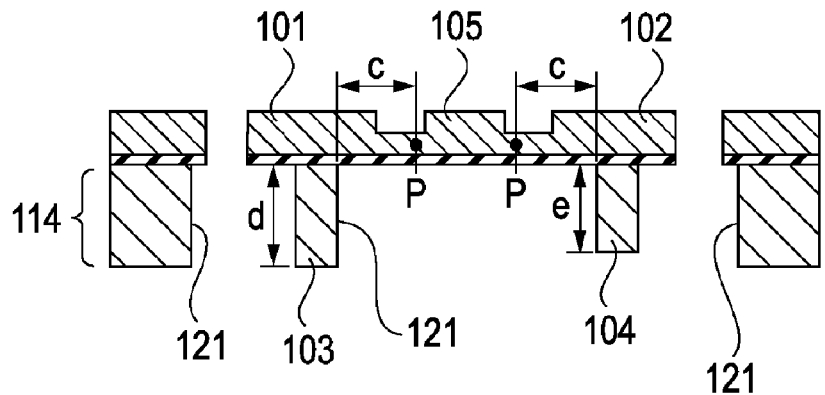
FIGS. 13A to 13C are process diagrams showing the overview of a second example method of fabricating a structure according to the fourth embodiment of the invention.

In a second method, referring to FIG. 13A, projections 103 and 104 having different lengths (lengths d and e) of processing portions 101 and 102 are formed at the same distance c from the base points P for bending the processing portions 101 and 102.

The projections 103 and 104 having the different lengths of the processing portions 101 and 102 may be formed by a similar method to that for forming the projections 303 and 304 of the processing portions 301 and 302 and the restraint segment 307 in the steps of FIGS. 9A to 9I.

Instead of the above-mentioned method, a similar method to that for forming the projections 303 and 304 of the processing portions 301 and 302 in the steps of FIGS. 11A to 11D, may be employed.

Figure 13B:
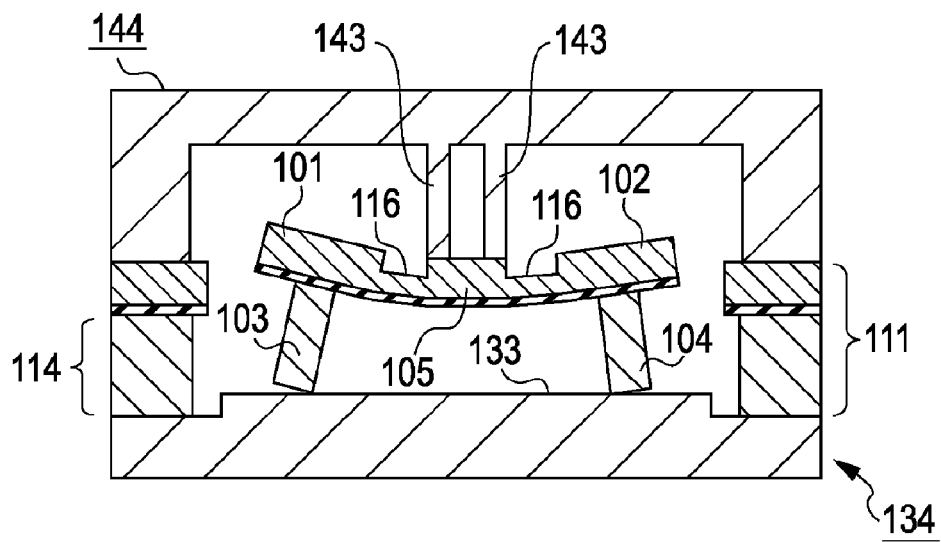
Figure 13C:
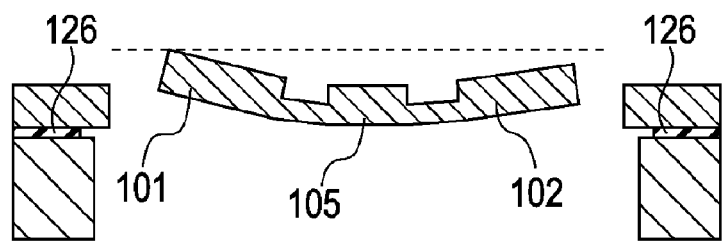

FIG. 13B shows the appearance when the mold 134 is pressed to the support layer 114 and the projections 103 and 104 of the processing portions 101 and 102. FIG. 13C shows the finished state.

Fifth Embodiment

This embodiment describes an example method of fabricating a structure having inclined segments, which are angled outward in directions opposite to each other with respect to a principal surface of a movable segment.

Figure 14K:
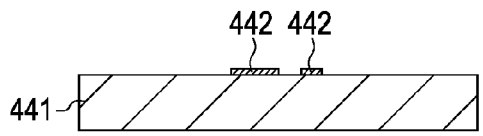
FIGS. 14A to 14R are process diagrams showing a method of fabricating a structure according to a fifth embodiment of the invention.
Figure 14L:
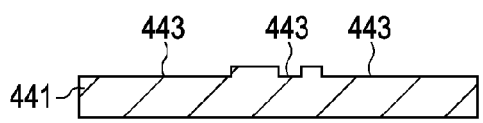
Figure 14M:
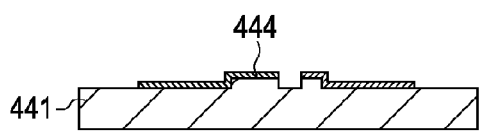
Figure 14N:
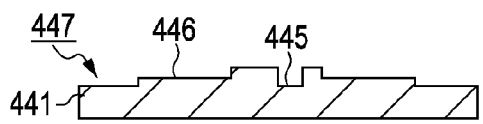
Figure 14O:
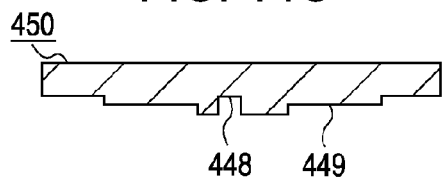
Figure 14P:
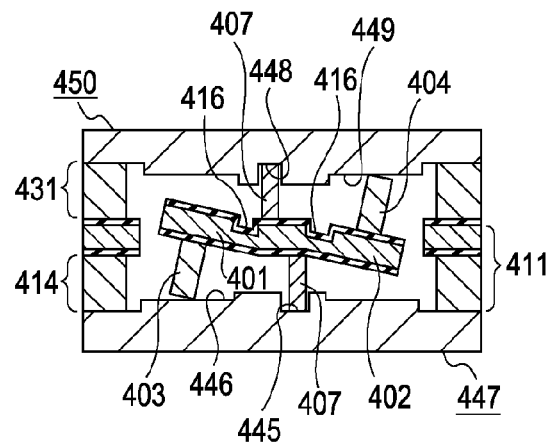
Figure 14Q:
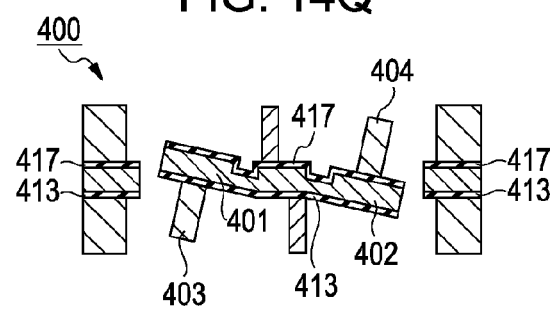
Figure 14R:
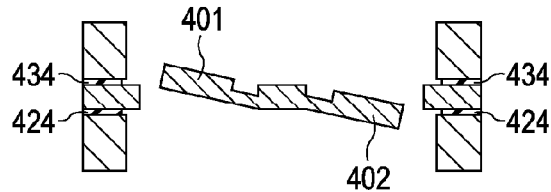

FIGS. 14A to 14R provide process diagrams for the method of fabricating a structure of this embodiment.

FIGS. 14A to 14R respectively correspond to steps (a) to (r) of this embodiment.

In steps (a) to (j), a structure 400, which includes processing portions 401 and 402 before inclination, projections 403 and 404 of the processing portions 401 and 402, a movable segment 405, a support segment 406, and projections 407 of the movable segment 405, is fabricated.

(a) A mask layer 415 is formed on a surface of a device layer 412 of a substrate 411.

The substrate 411 has a three-layer structure (the device layer 412, a sacrificial layer 413, a support layer 414) in a similar manner to the substrate 111 used in the step of FIG. 7A. For example, the substrate 111 may use a SOI substrate.

(b) A recess 416 is formed in the device layer 412.

At this time, the recess 416 has a depth smaller than a thickness of the device layer 412.

The recess 416 may be formed by a similar method to that for forming the recess 116 in the step of FIG. 7B.

(c) A sacrificial layer 417 is formed on a surface of the device layer 412.

The sacrificial layer 417 may be formed by depositing a material such as silicon oxide, so that the sacrificial layer 417 is deposited in a thin-film form.

(d) A mask layer 418 is formed on an upper surface of the sacrificial layer 417.

(e) A through hole 419 is formed in the sacrificial layer 417.

The through hole 419 may be formed by a similar method to that for forming the through hole 119 in the step of FIG. 7E.

(f) A through hole 420 is formed in the device layer 412 by using the sacrificial layer 417 as a mask.

The through hole 420 may be formed by a similar method to that for forming the through hole 118 in the step of FIG. 7D.

(g) A through hole 421 is formed in the sacrificial layer 413 of the substrate 411.

(h) A substrate 431 is bonded on an upper surface of the sacrificial layer 417.

The substrate 431 may be the same substrate as that of the support layer 414 of the substrate 411.

For example, when the substrate 411 is an SOI substrate, the substrate 431 may be a substrate made of monocrystalline silicon.

When the substrate 431 is a monocrystalline silicon substrate, anode bonding may be used as the bonding method.

(i) A mask layer 432 is formed on an upper surface of the substrate 431, and a mask layer 422 is formed on a lower surface of the support layer 414 of the substrate 411.

(j) A through hole 433 is formed in the substrate 431, and a through hole 423 is formed in the support layer 414.

Then, in steps (k) to (o), restraint segments 447 and 450, also function as molds for inclining the processing portions 401 and 402, are fabricated.

(k) A mask layer 442 is formed on a substrate 441.

The substrate 441 may be made of a material having a rigidity equivalent to or higher than a rigidity of the material of the substrate 411 and a thermal expansion coefficient close to a thermal expansion coefficient of the material of the device layer 412 of the substrate 411, for the same reason as that in the step of FIG. 7H.

For example, when the substrate 411 is a SOI substrate, a substrate made of the same monocrystalline silicon as that of the device layer 412 may be selected as the substrate 441.

(l) A recess 443 is formed in the substrate 441.

The recess 443 may be formed by a similar method to that for forming the recess 116 in the step of FIG. 7B.

(m) A mask layer 444 is formed on a substrate 441.

(n) A recess 445 and a projection 446 of the restraint segment 447 are formed at the substrate 441.

(o) In a similar manner to steps (k) to (n), the restraint segment 450 having a recess 448 and a projection 449 of the restraint segment 450 are fabricated.

Finally, in steps (p) to (r), elevation angles are applied to the processing portions 401 and 402 while the movement of the movable segment 405 is restricted. Then, the projections 403 and 404 of the processing portions 401 and 402, and the projections 407 of the movable segment 405 are removed.

(p) The recess 416 of the device layer 412 is heated, and the projections 446 and 449 of the restraint segments 447 and 450 are pressed to the projections 403 and 404 of the processing portions 401 and 402 while tip ends of the projections 407 of the movable segment 405 face the recesses 445 and 448 of the restraint segments 447 and 450. Thus, the recesses 416 are plastically deformed.

The recesses 416 may be plastically deformed by a similar method to that in the step of FIG. 8P.

(q) Cooling is conducted, and then the restraint segments 447 and 450 are detached from the structure 400.

(r) Parts of the sacrificial layers 413 and 417 not occupied by sacrificial layers 424 and 434 are removed. Hence, the projections 403 and 404 of the processing portions 401 and 402, and the projections 407 of the movable segment 405 are removed.

The projections 403 and 404 of the processing portions 401 and 402, and the projections 407 of the movable segment 405 are fixed to the processing portions 401 and 402, and the movable segment 405 only via the sacrificial layers 413 and 417.

Thus, in this step, the projections 403 and 404 of the processing portions 401 and 402, and the projections 407 of the movable segment 405 are removed with the sacrificial layers 413 and 417.

The sacrificial layer 413 may be removed by a similar method to that in the step of FIG. 7O.

Figure 16:
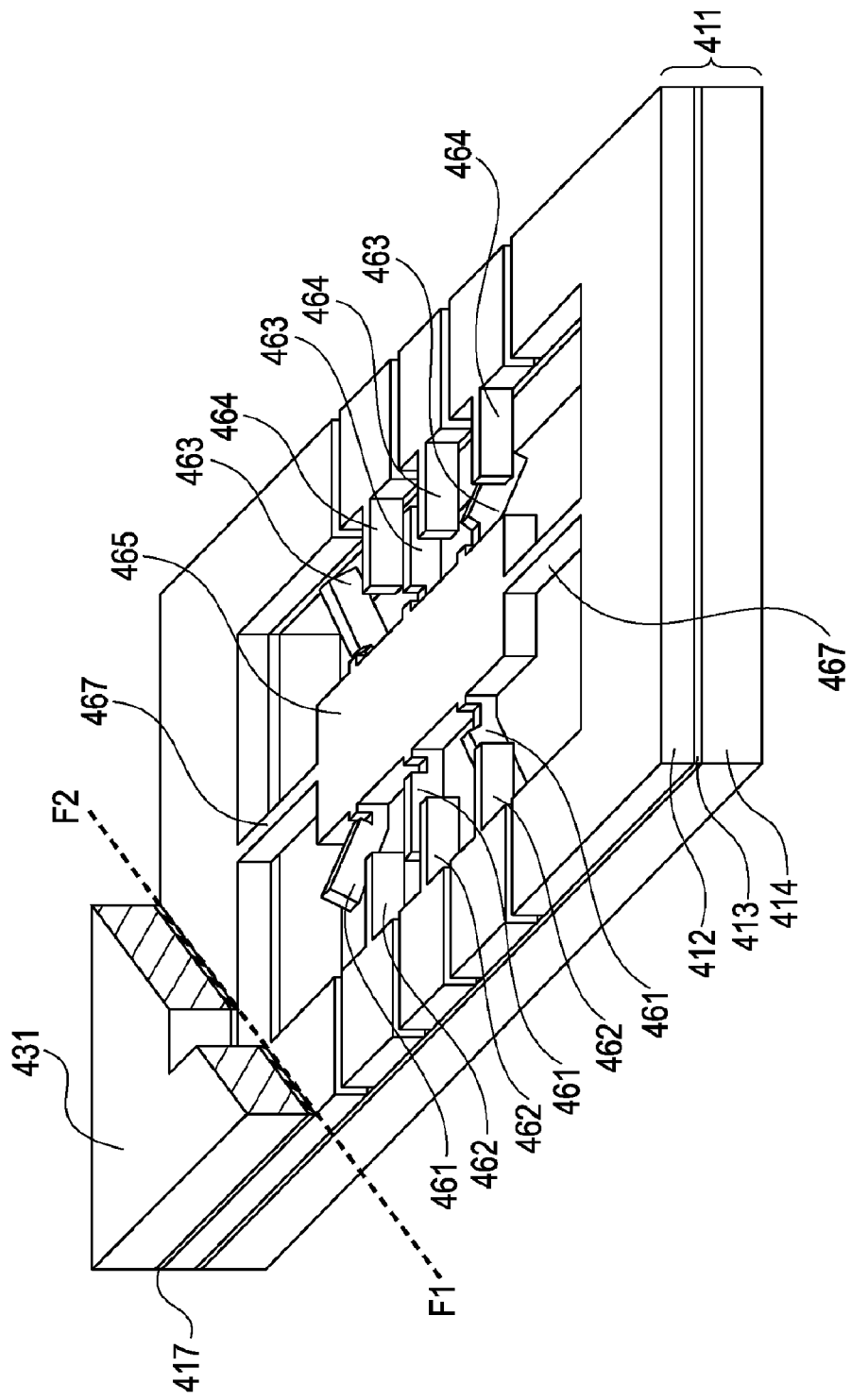
FIG. 16 illustrates an example of an AVC fabricated by the method of fabricating a structure according to the fifth embodiment of the invention.

FIG. 16 shows an example structure fabricated by the above-described method (for easier understanding, the substrate 431 and the sacrificial layer 417 being cut along a vertical plane passing through broken line F1-F2).

FIG. 16 illustrates an AVC having movable combs 461 and 463 serving as a plurality of processing portions inclined upward and downward with respect to a principal surface of a board 465 serving as a movable segment.

When the board 465 vibrates in a rotation direction around a torsion spring 467, the movable combs 461 and 463 are displaced with the board 465. Accordingly, a capacitance between the movable comb 461 and a fixed comb 462, and a capacitance between the movable comb 463 and a fixed comb 464 change in accordance with a displacement of the board 465.

With the fabricating method of this embodiment, such a complex structure can be fabricated.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-165080 filed Jun. 24, 2008, which is hereby incorporated by reference herein in its entirety.

What is claimed is:

1. A method of fabricating a structure by plastically deforming a processing portion, provided at a movable segment supported by a substrate, thereby having an inclined portion inclined with respect to a principal surface of the movable segment, the method comprising the steps of:
    providing a restraint segment configured to restrain movement of a portion other than the processing portion of the movable segment, in contact with at least a part of the portion other than the processing portion;
    applying a force to the processing portion, thereby plastically deforming the processing portion; and
    removing at least a part of the restraint segment.

2. The method of fabricating a structure according to claim 1,
    wherein the restraint segment has at least one projection, and wherein, during plastically deforming the processing portion, the movement of the movable segment is restrained by bringing the projection of the restraint segment to come into contact with at least a part of the movable segment.

3. The method of fabricating a structure according to claim 1,
    wherein the movable segment has at least one projection, wherein the restraint segment has at least one recess, and wherein, during plastically deforming the processing portion, the projection of the movable segment contacts at least a part of an inner wall and at least a part of a bottom surface of the recess of the restraint segment.

4. The method of fabricating a structure according to claim 1, wherein the restraint segment restrains the movable segment and the substrate by fixing both the movable segment and the substrate.

5. The method of fabricating a structure according to claim 3,
    wherein the restraint segment is provided at the movable segment or the substrate via a sacrificial layer, and
    wherein the removing the restraint segment includes the step of removing at least a part of the sacrificial layer provided with the restraint segment.

6. The method of fabricating a structure according to claim 5, wherein the restraint segment has a through hole extending from a tip end of the restraint segment to a part of the restraint segment adjacent to the sacrificial layer.

7. The method of fabricating a structure according to claim 1, further comprising the step of pressing a mold to the processing portion.

8. The method of fabricating a structure according to claim 1, further comprising the step of providing a projection at the processing portion.

9. The method of fabricating a structure according to claim 8, further comprising the step of pressing a mold to the projection provided at the processing portion.

10. The method of fabricating a structure according to claim 9,
    wherein at least two processing portions are provided, and
    wherein the processing portions respectively have projections, the projections projecting from a front surface or a back surface of the principal surface of the movable segment with respect to the principal surface.

11. The method of fabricating a structure according to claim 9, wherein at least two processing portions are provided, and wherein the processing portions respectively have projections, the projection of at least one of the processing portions projecting in a direction opposite to a direction in which the projection of the other processing portion projects, with respect to the principal surface of the movable segment.

12. The method of fabricating a structure according to claim 10, wherein the projections of the processing portions are provided at positions such that distances from positions for bending the processing portions correspond to angles at which the processing portions are inclined.

13. The method of fabricating a structure according to claim 10, wherein the projections of the plurality of processing portions have lengths corresponding to angles of the processing portions to be inclined.

14. The method of fabricating a structure according to claim 1, further comprising the step of providing a recess at the processing portion.

15. The method of fabricating a structure according to claim 1, further comprising the step of heating at least a part of the processing portion of the structure.

* * * * *